(12) United States Patent
Sasaki et al.

(10) Patent No.: US 8,860,022 B2
(45) Date of Patent: Oct. 14, 2014

(54) OXIDE SEMICONDUCTOR FILM AND SEMICONDUCTOR DEVICE

(71) Applicant: Semiconductor Energy Laboratory Co., Ltd., Atsugi (JP)

(72) Inventors: Toshinari Sasaki, Shinagawa (JP); Shuhei Yokoyama, Yaizu (JP); Takashi Hamochi, Shimotsuga (JP); Yusuke Nonaka, Isehara (JP); Yasuharu Hosaka, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/862,716

(22) Filed: Apr. 15, 2013

(65) Prior Publication Data

US 2013/0285045 A1    Oct. 31, 2013

(30) Foreign Application Priority Data

Apr. 27, 2012   (JP) .................. 2012-103302

(51) Int. Cl.
*H01L 29/10* (2006.01)
*H01L 29/786* (2006.01)
*H01L 27/12* (2006.01)

(52) U.S. Cl.
CPC ................. *H01L 29/7869* (2013.01); *H01L 27/1225* (2013.01)
USPC ........................................................ 257/43

(58) Field of Classification Search
CPC .................. H01L 27/1225; H01L 29/7869
USPC ........................................................ 257/43
See application file for complete search history.

(56) References Cited

U.S. PATENT DOCUMENTS

| 5,528,032 A | 6/1996 | Uchiyama |
| 5,731,856 A | 3/1998 | Kim et al. |

(Continued)

FOREIGN PATENT DOCUMENTS

| EP | 1737044 A | 12/2006 |
| EP | 2226847 A | 9/2010 |

(Continued)

OTHER PUBLICATIONS

Nomura.K et al., "Growth mechanism for single-crystalline thin film of InGaO3(ZnO)5 by reactive solid-phase epitaxy,", J. Appl. Phys. (Journal of Applied Physics) , May 15, 2004, vol. 95, No. 10, pp. 5532-5539.

(Continued)

*Primary Examiner* — Trung Q Dang
(74) *Attorney, Agent, or Firm* — Eric J. Robinson; Robinson Intellectual Property Law Office, P.C.

(57) ABSTRACT

A method for evaluating an oxide semiconductor film, a method for evaluating a transistor including an oxide semiconductor film, a transistor which includes an oxide semiconductor film and has favorable switching characteristics, and an oxide semiconductor film which is applicable to a transistor and enables the transistor to have favorable switching characteristics are provided. A PL spectrum of an oxide semiconductor film obtained by low-temperature PL spectroscopy has a first curve whose local maximum value is found in a range of 1.6 eV or more and 1.8 eV or less and a second curve whose local maximum value is found in a range of 1.7 eV or more and 2.4 eV or less. A value obtained by dividing the area of the second curve by the sum of the area of the first curve and the area of the second curve is 0.1 or more and less than 1.

16 Claims, 22 Drawing Sheets

(56) References Cited

U.S. PATENT DOCUMENTS

| | | |
|---|---|---|
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 8,237,166 B2 | 8/2012 | Kumomi et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0074963 A1 | 4/2005 | Fujii et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287221 A1 | 12/2007 | Ong et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0027580 A1 | 1/2009 | Kurokawa et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0184315 A1 | 7/2009 | Lee et al. |
| 2009/0267068 A1 | 10/2009 | Dairiki et al. |
| 2009/0278122 A1 | 11/2009 | Hosono et al. |
| 2009/0280600 A1 | 11/2009 | Hosono et al. |
| 2010/0032665 A1 | 2/2010 | Yamazaki et al. |
| 2010/0051949 A1 | 3/2010 | Yamazaki et al. |
| 2010/0065844 A1 | 3/2010 | Tokunaga |
| 2010/0072468 A1 | 3/2010 | Yamazaki et al. |
| 2010/0092800 A1 | 4/2010 | Itagaki et al. |
| 2010/0109002 A1 | 5/2010 | Itagaki et al. |
| 2010/0109003 A1 | 5/2010 | Akimoto et al. |
| 2010/0219410 A1 | 9/2010 | Godo et al. |
| 2011/0133180 A1 | 6/2011 | Yamazaki |
| 2011/0147739 A1 | 6/2011 | Yamazaki et al. |
| 2011/0151618 A1 | 6/2011 | Yamazaki et al. |
| 2011/0156026 A1 | 6/2011 | Yamazaki et al. |
| 2011/0260171 A1* | 10/2011 | Yamazaki ............... 257/60 |
| 2011/0284848 A1 | 11/2011 | Yamazaki |
| 2012/0061663 A1 | 3/2012 | Yamazaki et al. |
| 2012/0064664 A1 | 3/2012 | Yamazaki et al. |
| 2012/0132907 A1 | 5/2012 | Yamazaki et al. |
| 2012/0241735 A1 | 9/2012 | Honda et al. |
| 2012/0261657 A1 | 10/2012 | Takahashi et al. |
| 2013/0043466 A1 | 2/2013 | Nomura et al. |
| 2013/0153892 A1 | 6/2013 | Sasaki et al. |
| 2013/0161610 A1 | 6/2013 | Yamazaki |
| 2013/0164899 A1 | 6/2013 | Koezuka et al. |
| 2013/0228774 A1 | 9/2013 | Okazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-298062 A | 10/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2007-096055 A | 4/2007 |
| JP | 2008-108985 A | 5/2008 |
| JP | 2010-040552 A | 2/2010 |

(56) References Cited

FOREIGN PATENT DOCUMENTS

| JP | 2010-177431 A | 8/2010 |
|---|---|---|
| JP | 2012-084867 A | 4/2012 |
| WO | WO-2004/114391 | 12/2004 |

OTHER PUBLICATIONS

Kamiya. T et al., "Carrier transport properties and electronic structures of amorphous oxide semiconductors: the present status,", Solid State Physics, Sep. 1, 2009, vol. 44, No. 9, pp. 621-633, Agne Gijutsu Center.

Nakayama et al., "17a-TL-8 Effect of GaO Layer on IGZO-TFT Channel,", Extended Abstracts (The 57th Spring Meeting 2010), The Japan Society of Applied Physics and Related Societies, Mar. 17, 2010, pp. 21-008.

Jeong.Y et al., "Bias-Stress-Stable Solution-Processed Oxide Thin Film Transistors,", ACS Applied Materials & Interfaces, Feb. 26, 2010, vol. 2, No. 3, pp. 611-615.

Kamiya.T et al., "Origins of High Mobility and Low Operation Voltage of Amorphous Oxide TFTs: Electronic Structure, Electron Transport, Defects and Doping,", Journal of Display Technology, Jul. 1, 2009, vol. 5, No. 7, pp. 273-288.

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42:1: Invited Paper: Improved Amorphous In-Ga-Zn-O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3-Ga2ZnO4-ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In-Ga-Zn-Oxide TFTs,", IDW '09 : Proceedings of the 16th International Display Workshops, 2009, pp. 689-692.

(56) References Cited

OTHER PUBLICATIONS

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.
Park.S et al., "Challenge to Future Displays: Transparent AM-OLED Driven by Peald Grown ZnO TFT,", IMID '07 Digest, 2007, pp. 1249-1252.
Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.
Osada.T et al., "Development of Driver-Integrated Panel Using Amorphous In-Ga-Zn-Oxide TFT,", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDS,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.
Ohara.H et al., "21.3:4.0 In. QVGA AMOLED Display Using In-Ga-Zn-Oxide TFTs With a Novel Passivation Layer,", SID Digest '09 : SID International Symposium Digest of Technical Papers, May 31, 2009, pp. 284-287.
Miyasaka.M, "SUFTLA Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.
Lee.H et al., "Current Status of, Challenges to, and Perspective View of AM-OLED ,", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.
Nakamura.M, "Synthesis of Homologous Compound with New Long-Period Structure,", NIRIM Newsletter, Mar. 1, 1995, vol. 150, pp. 1-4.
Kikuchi.H et al., "Polymer-Stabilized Liquid Crystal Blue Phases,", Nature Materials, Sep. 2, 2002, vol. 1, pp. 64-68.
Kimizuka.N et al., "Spinel,YbFe2O4, and Yb2Fe3O7 Types of Structures for Compounds in the In2O3 and Sc2O3-A2O3-Bo Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.
Kitzerow.H et al., "Observation of Blue Phases in Chiral Networks,", Liquid Crystals, 1993, vol. 14, No. 3, pp. 911-916.
Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.
Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.
Orita.M et al., "Mechanism of Electrical Conductivity of Transparent InGaZnO4,", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.
Janotti.A et al., "Native Point Defects in ZnO,", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.
Janotti.A et al., "Oxygen Vacancies in ZnO,", Appl. Phys. Lett. (Applied Physics Letters) , 2005, vol. 87, pp. 122102-1-122102-3.
Oba.F et al., "Defect energetics in ZnO: A hybrid Hartree-Fock density functional study,", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor,", Philosophical Magazine, 2001, vol. 81, No. 5, pp. 501-515.
Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays,", IDW '08 : Proceedings of the 6th International Display Workshops, Dec. 3, 2008, pp. 581-584.
Kim.S et al., "High-Performance oxide thin film transistors passivated by various gas plasmas,", 214th ECS Meeting, 2008, No. 2317, ECS.
Clark.S et al., "First Principles Methods Using CASTEP,", Zeitschrift fur Kristallographie, 2005, vol. 220, pp. 567-570.
Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.
Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

* cited by examiner

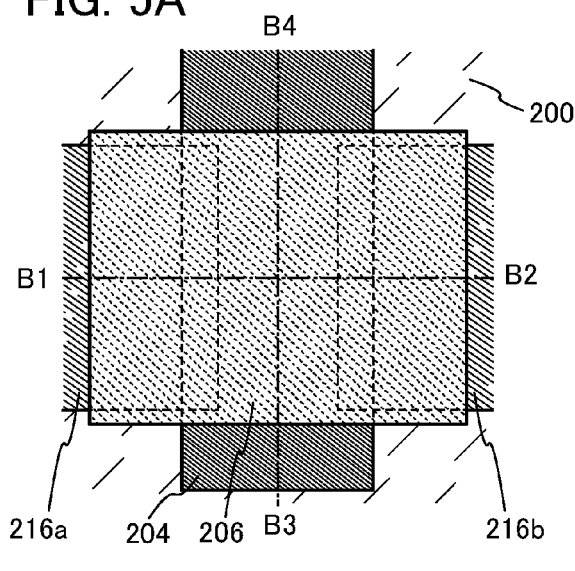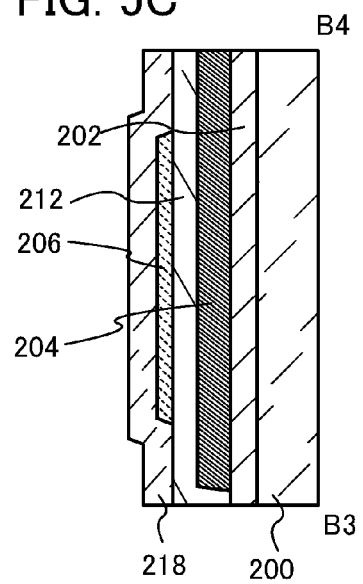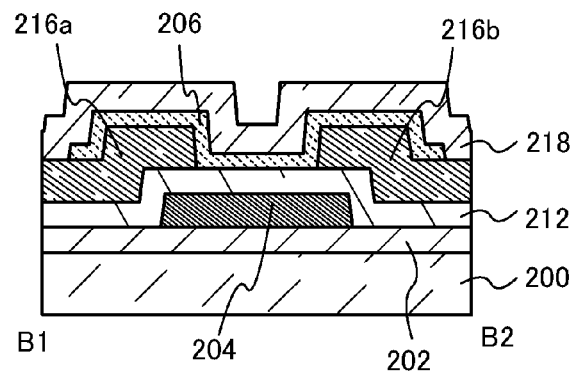

OXIDE SEMICONDUCTOR FILM AND SEMICONDUCTOR DEVICE

BACKGROUND OF THE INVENTION

1. Field of the Invention

The present invention relates to an oxide semiconductor film, a method for evaluating an oxide semiconductor film, a semiconductor device, and a method for evaluating a semiconductor device.

Note that in this specification, a semiconductor device refers to any device that can function by utilizing semiconductor characteristics, and an electro-optical device, a semiconductor circuit, an electronic device, and the like are all semiconductor devices.

Further, the present invention relates to an object, a method, a manufacturing method, a process, a machine, manufacture, or a composition of matter. In particular, the present invention relates to, for example, a semiconductor film, a semiconductor device, a display device, a liquid crystal display device, a light-emitting device, a driving method thereof, or a production method thereof. Specifically, the present invention relates to, for example, a semiconductor device, a display device, or a light-emitting device including a transistor or a driving method thereof. Further, the present invention relates to, for example, an electronic device including the semiconductor device, the display device, or the light-emitting device.

2. Description of the Related Art

A technique for forming a transistor by using a semiconductor film formed over a substrate having an insulating surface has attracted attention. The transistor is applied to a wide range of semiconductor devices such as an integrated circuit and a display device. A silicon film is known as a semiconductor film applicable to a transistor.

Whether an amorphous silicon film or a polycrystalline silicon film is used as a silicon film in a transistor depends on the purpose. For example, in the case of a transistor included in a large-sized display device, it is preferred to use an amorphous silicon film, which can be formed using the established technique for forming a film on a large-sized substrate. On the other hand, in the case of a transistor included in a high-performance display device where driver circuits are formed over the same substrate, it is preferred to use a polycrystalline silicon film, which can form a transistor having a high field-effect mobility. As a method for forming a polycrystalline silicon film, high-temperature heat treatment or laser light treatment which is performed on an amorphous silicon film has been known.

Further, in recent years, an oxide semiconductor film has attracted attention. For example, a transistor which includes an amorphous oxide semiconductor film containing indium, gallium, and zinc and having a carrier density less than $10^{18}/cm^3$ is disclosed (see Patent Document 1).

An oxide semiconductor film can be formed by a sputtering method, and thus can be used for a transistor in a large-sized display device. Moreover, a transistor including an oxide semiconductor film has a high field-effect mobility; therefore, a high-performance display device where driver circuits are formed over the same substrate can be obtained. In addition, there is an advantage that capital investment can be reduced because part of production equipment for a transistor including an amorphous silicon film can be retrofitted and utilized.

An oxide semiconductor film is known to be sensitive to hydrogen and an oxygen vacancy (see Non-Patent Document 1). That is, it is important to control hydrogen and oxygen vacancies in an oxide semiconductor film in order that a transistor including the oxide semiconductor film has favorable switching characteristics.

However, since hydrogen is not a main component of an oxide semiconductor film, its evaluation requires an analysis method with high detection sensitivity. In addition, since hydrogen is a light element, its analysis method is limited. Therefore, it is sometimes difficult to evaluate hydrogen in an oxide semiconductor film.

Oxygen is a main component of an oxide semiconductor film. Thus, its analysis method is limited to a method capable of analyzing a main component. It is difficult to evaluate a minute change using a method suitable for analyzing a main component. Therefore, it is difficult to evaluate a minute increase or decrease in the amount of oxygen in an oxide semiconductor film. In other words, it is difficult to evaluate oxygen vacancies in an oxide semiconductor film.

As described above, it has been difficult to evaluate hydrogen and oxygen vacancies in an oxide semiconductor film. Therefore, it has been evaluated whether a transistor including an oxide semiconductor film has favorable switching characteristics by actually fabricating a transistor.

Note that low-temperature photoluminescence (PL) spectroscopy is disclosed as a method for evaluating defect states in an oxide semiconductor film (see Patent Document 2). According to Patent Document 2, a PL spectrum of an oxide semiconductor film which is obtained by low-temperature PL spectroscopy has a peak around 1.8 eV.

REFERENCE

[Patent Document]
[Patent Document 1] Japanese Published Patent Application No. 2006-165528
[Patent Document 2] Japanese Published Patent Application No. 2012-84867
[Non-Patent Document]
[Non-Patent Document 1] Toshio Kamiya, Kenji Nomura, and Hideo Hosono, "Origins of High Mobility and Low Operation Voltage of Amorphous Oxide TFTs: Electronic Structure, Electron Transport, Defects and Doping", Journal of Display Technology, Vol. 5, No. 7, 2009, pp. 273-288.

SUMMARY OF THE INVENTION

An object is to provide a method for evaluating an oxide semiconductor film. Another object is to provide a method for evaluating a transistor including an oxide semiconductor film.

Another object is to provide a transistor which includes an oxide semiconductor film and has favorable switching characteristics. Another object is to provide an oxide semiconductor film which is applicable to a transistor and enables the transistor to have favorable switching characteristics.

Another object is to provide a transistor or the like having low off-state current. Another object is to provide a transistor or the like having high field-effect mobility. Another object is to provide a transistor or the like with high yield. Another object is to provide a semiconductor device or the like including the transistor or the like. Another object is to provide a novel semiconductor device or the like.

Note that the description of these objects does not impede the existence of other objects. Note that in one embodiment of the present invention, there is no need to achieve all the objects. Other objects will be apparent from and can be derived from the description of the specification, the drawings, the claims, and the like.

A PL spectrum of an oxide semiconductor film according to one embodiment of the present invention, which is obtained by low-temperature PL spectroscopy, has a first curve whose local maximum value is found in a range of greater than or equal to 1.6 eV and less than or equal to 1.8 eV and a second curve whose local maximum value is found in a range of greater than or equal to 1.7 eV and less than or equal to 2.4 eV. A value obtained by dividing the area of the second curve by the sum of the area of the first curve and the area of the second curve is greater than or equal to 0.1 and less than 1.

Note that the oxide semiconductor film contains any of indium, gallium, tin, hafnium, and zinc.

A semiconductor device according to one embodiment of the present invention includes the above oxide semiconductor film, a gate insulating film in contact with the oxide semiconductor film, and a gate electrode overlapping with the oxide semiconductor film with the gate insulating film provided therebetween.

In low-temperature PL spectroscopy, a sample is irradiated with light having energy which is larger than the band gap of a substance constituting the sample at low temperature (e.g., about 100 K or about 10 K), whereby carriers (electrons and holes) are generated. The generated carriers are recombined to return to the thermal equilibrium state, whereas part of the carriers goes through a radiative recombination process, so that PL is emitted. By detecting this PL with a detector, a PL spectrum of the sample can be measured. In recent years, detectors have been improved in accuracy, which has enabled PL spectra to be measured at extremely high sensitivity.

Note that the PL emission from the sample includes emission due to band-to-band recombination, emission due to recombination of free excitons, emission due to recombination of bound excitons, emission due to recombination between a donor level and the valence band, emission due to recombination between the conductive band and an acceptor level, and emission due to donor-acceptor pair recombination (also referred to as D-A pair light emission).

Hydrogen and an oxygen vacancy in an oxide semiconductor film might cause a donor level to be formed. That is, when hydrogen or/and an oxygen vacancy exists in the oxide semiconductor film, light emitted owing to recombination between a donor level and the valence band might be detected. The cause of formation of a donor level (e.g., hydrogen or an oxygen vacancy) can be identified by analyzing the PL spectrum.

According to specific analysis of a PL spectrum obtained by low-temperature PL spectroscopy on an oxide semiconductor film, it was found that the spectrum with a peak around 1.8 eV which is disclosed in Patent Document 2 can be divided into two. Specifically, the spectrum with a peak around 1.8 eV can be divided into a first curve whose local maximum value is found in a range of greater than or equal to 1.6 eV and less than or equal to 1.8 eV and a second curve whose local maximum value is found in a range of greater than or equal to 1.7 eV and less than or equal to 2.4 eV. Note that each of the first and second curves is a spectrum represented by a Gaussian function.

The Gaussian function can be expressed by Formula 1. Note that a, b, and c in Formula 1 are arbitrary numbers.

$$f(x) = a\, \exp\left[-\frac{(x-b)^2}{2c^2}\right]$$ [FORMULA 1]

Further, according to examination of the relationship between switching characteristics of a transistor and the ratio between the area of the first curve and the area of the second curve, the following was found: a transistor which includes an oxide semiconductor film with a PL spectrum in which a value obtained by dividing the area of the second curve by the sum of the area of the first curve and the area of the second curve is greater than or equal to 0.1 and less than 1 has favorable switching characteristics, whereas a transistor which includes an oxide semiconductor film with a PL spectrum in which a value obtained by dividing the area of the second curve by the sum of the area of the first curve and the area of the second curve is less than 0.1 does not have favorable switching characteristics. Note that the area of each of the first and second curves is the product of the peak height and the full width at half maximum (FWHM). Here, FWHM can be expressed by Formula 2.

$$FWHM = 2\sqrt{2\ln 2} \cdot c$$ [FORMULA 2]

With this evaluation method, in the case where PL is detectable, a transistor or a semiconductor device can be evaluated without being broken. Note that the case where part or the whole of the transistor or the semiconductor device is broken through the evaluation is not excluded. Since the transistor or the semiconductor device can be evaluated without being broken, the evaluation method can be used for in-process evaluation during a manufacturing process of the transistor or the semiconductor device.

A PL spectrum obtained by low-temperature PL spectroscopy is analyzed by approximation by a Gaussian function, whereby an oxide semiconductor film can be evaluated. Further, a transistor including the oxide semiconductor film can be evaluated.

By analyzing the PL spectrum obtained by low-temperature PL spectroscopy, it can be determined whether the transistor including the oxide semiconductor film has favorable switching characteristics. Further, it can be determined whether the oxide semiconductor film applicable to a transistor enables the transistor to have favorable switching characteristics. Consequently, a transistor which includes an oxide semiconductor film and has favorable switching characteristics can be provided. Further, an oxide semiconductor film which is applicable to a transistor and enables the transistor to have favorable switching characteristics can be provided.

BRIEF DESCRIPTION OF THE DRAWINGS

FIGS. 5A to 5C are a top view and cross-sectional views illustrating an example of a transistor according to one embodiment of the present invention.

DETAILED DESCRIPTION OF THE INVENTION

Figure 1A:
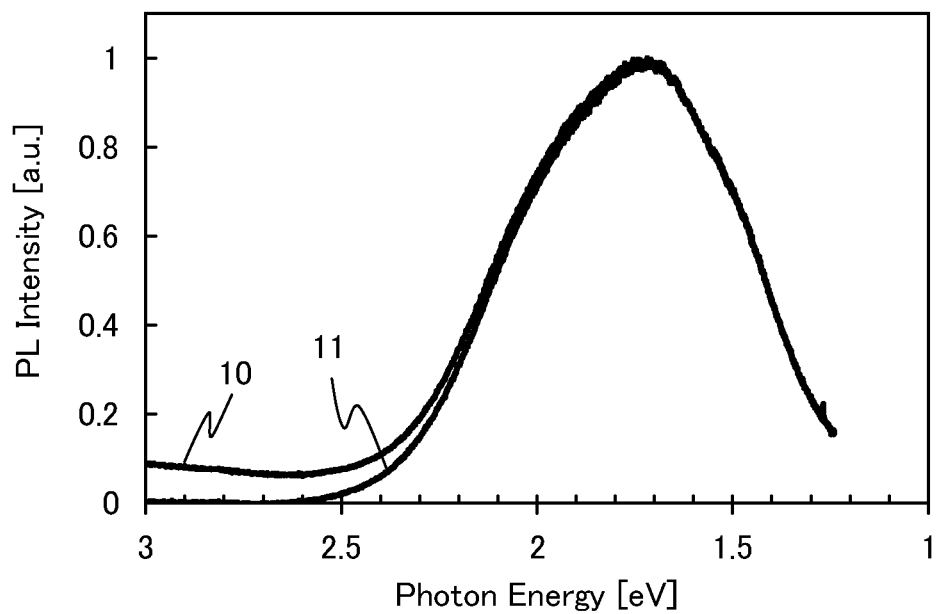
FIGS. 1A and 1B show PL spectra obtained by low-temperature PL spectroscopy according to one embodiment of the present invention and a method for analyzing the PL spectra.

Embodiments and an example of the present invention will be described in detail with reference to the accompanying drawings. However, the present invention is not limited to the description below, and it is easily understood by those skilled in the art that modes and details disclosed herein can be modified in various ways. Therefore, the present invention is not construed as being limited to description of the embodiments and the example. In describing structures of the present invention with reference to the drawings, the same reference numerals are used in common for the same portions in different drawings. Note that the same hatch pattern is applied to similar parts, and the similar parts are not especially denoted by reference numerals in some cases.

Note that a voltage refers to a potential difference between a certain potential and a reference potential (e.g., a ground potential (GND) or a source potential) in many cases. Accordingly, a voltage can also be called a potential.

Even when the expression "to be electrically connected" is used in this specification, there is a case in which no physical connection is made and a wiring is just extended in an actual circuit.

Note that the ordinal numbers such as "first" and "second" in this specification are used for convenience and do not denote the order of steps or the stacking order of layers. In addition, the ordinal numbers in this specification do not denote particular names which specify the present invention.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

Embodiment 1

In this embodiment, an oxide semiconductor film according to one embodiment of the present invention will be described. A method for evaluating a PL spectrum of an oxide semiconductor film which is obtained by low-temperature PL spectroscopy will also be described.

First, a method for analyzing a PL spectrum of an oxide semiconductor film which is obtained by low-temperature PL spectroscopy will be described.

Figure 1B:
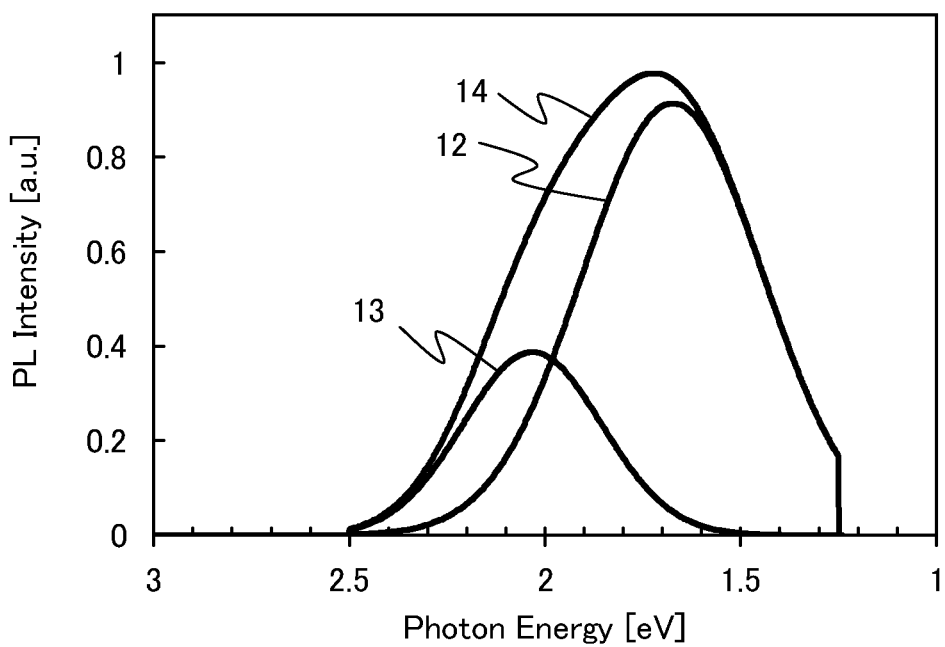

FIGS. 1A and 1B show examples of PL spectra of an oxide semiconductor film which are obtained by low-temperature PL spectroscopy. FIG. 1A shows a curve 10, which is a PL spectrum obtained by low-temperature PL spectroscopy on a sample including the oxide semiconductor film, and a curve 11, which is obtained by subtracting a background spectrum attributed to a substrate or the like from the curve 10. That is, the curve 11 shows a PL spectrum which is closer to that of the oxide semiconductor film itself. Thus, a PL spectrum obtained by subtraction of a background spectrum is used for the description below, unless otherwise specified.

FIG. 1B shows a curve 12 and a curve 13, which are represented by a Gaussian function, and a curve 14, which is the sum of the curve 12 and the curve 13. Owing to measurement limitations, an energy range of less than or equal to 1.24 eV is not shown. Here, the curve 12 and the curve 13 are curves which are determined by calculation so that the curve 14 is an approximate curve of the curve 11 shown in FIG. 1A. This means that the curve 11 is an approximate curve of the sum of the curve 12 and the curve 13, which are represented by a Gaussian function. Note that the curve 12 and the curve 13 are determined by calculation so that in an energy range of greater than or equal to 1.25 eV and less than or equal to 2.5 eV, the square root (also referred to as root-mean-square) of a value obtained by adding up the squares of the differences between the curve 11 and the curve 14 at respective measurement points and dividing the sum by the number of the measurement points is less than or equal to 0.05, less than or equal to 0.02, or less than or equal to 0.01. The smaller the root-mean-square is, the smaller the deviation between the curve 11 and the curve 14 is.

In the above manner, the PL spectrum obtained by low-temperature PL spectroscopy on the oxide semiconductor film can be divided into two curves which are represented by a Gaussian function. Note that, for convenience, the two curves after division are referred to as curves (or peaks) of the PL spectrum. Specifically, the curve having a peak on the lower energy side is referred to as a first curve, and the curve having a peak on the higher energy side is referred to as a second curve.

Next, an oxide semiconductor film according to one embodiment of the present invention is described with reference to FIGS. 2A and 2B.

Figure 2A:
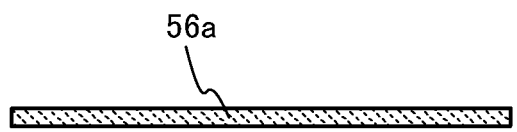
FIGS. 2A and 2B are cross-sectional views each including an oxide semiconductor film according to one embodiment of the present invention.
Figure 2B:
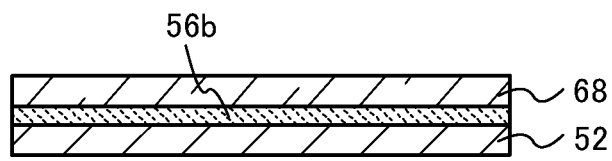

FIG. 2A illustrates an oxide semiconductor film 56a. Note that the oxide semiconductor film 56a is illustrated as, but not limited to, being constituted by a single kind of oxide semiconductor. For example, the oxide semiconductor film 56a may be a stack of plural kinds of oxide semiconductor films or a mixed layer including plural kinds of oxide semiconductors.

The oxide semiconductor film 56a is an oxide semiconductor film whose PL spectrum obtained by low-temperature PL spectroscopy is divided into two curves (a first curve and a second curve) as a result of analysis. Here, a value obtained by dividing the area of the second curve by the sum of the area of the first curve and the area of the second curve is greater than or equal to 0.1 and less than 1. Note that although the curve 12, which corresponds to the first curve, in an energy range of less than or equal to 1.24 eV is not shown in FIGS. 1A and 1B, the area of the first curve is calculated with the energy range of less than or equal to 1.24 eV taken into consideration.

Note that the oxide semiconductor film 56a contains any of indium, gallium, tin, hafnium, and zinc.

The ranges where the local maximum values of the first curve and the second curve are found vary depending on the kind of the oxide semiconductor film. Specifically, when the oxide semiconductor film 56a is an In—Ga—Zn oxide, the local maximum value of the first curve is found in a range of greater than or equal to 1.6 eV and less than or equal to 1.8 eV, and the local maximum value of the second curve is found in a range of greater than or equal to 1.7 eV and less than or equal to 2.4 eV. More specifically, when the In—Ga—Zn oxide has an atomic ratio of In:Ga:Zn=1:1:1, the local maximum value of the first curve is found in a range of greater than or equal to 1.6 eV and less than or equal to 1.8 eV, and the local maximum value of the second curve is found in a range of greater than or equal to 1.9 eV and less than or equal to 2.2 eV.

Note that the local maximum value of the first curve and the local maximum value of the second curve might be found close to the above local maximum values also in the case where an In—M-Zn oxide is used instead of the In—Ga—Zn oxide. Accordingly, an In—M-Zn oxide can also be applied to the oxide semiconductor film according to one embodiment of the present invention. Note that the element M is an element whose bond energy with oxygen is higher than that of In and that of Zn. Alternatively, the metal element M is an element which has a function of suppressing desorption of oxygen from the In—M-Zn oxide. Owing to the effect of the element M, generation of oxygen vacancies in the oxide semiconductor film is suppressed. Note that oxygen vacancies in the oxide semiconductor film generate carriers in some cases. Therefore, the effect of the element M can suppress an increase in the carrier density of the oxide semiconductor film, thereby preventing an increase in off-state current. Furthermore, a change in the electrical characteristics of the transistor, which is caused by oxygen vacancies, can be reduced, whereby a highly reliable transistor can be obtained.

The element M may be, specifically, Al, Si, Sc, Ti, V, Cr, Mn, Fe, Co, Ni, Ge, Y, Zr, Nb, Mo, Sn, La, Ce, Pr, Nd, Sm, Eu, Gd, Tb, Dy, Ho, Er, Tm, Yb, Lu, Hf, Ta, or W, and is preferably Al, Ti, Y, Zr, Ce, or Hf. For the element M, one or more elements may be selected from the above elements.

A structure of an oxide semiconductor film which can be used as the oxide semiconductor film 56a is described below.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

In a transistor using the CAAC-OS film, change in electric characteristics due to irradiation with visible light or ultraviolet light is small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

In the PL spectrum of the oxide semiconductor film 56a which is obtained by low-temperature PL spectroscopy, a value obtained by dividing the area of the second curve by the sum of the area of the first curve and the area of the second curve is greater than or equal to 0.1 and less than 1. Accordingly, as described above, a transistor including the oxide semiconductor film 56a has favorable switching characteristics.

Next, a structure which is different from that in FIG. 2A is described with reference to FIG. 2B. FIG. 2B illustrates an oxide semiconductor film 56b which is sandwiched between an insulating film 52 and an insulating film 68.

In an oxide semiconductor film, hydrogen and an oxygen vacancy serve as a donor to generate electrons. Further, another impurity (a minor component excluding a main component) serves as a donor to generate electrons. That is, an oxide semiconductor film is affected by the environment in some cases. Excluding use for specific applications (e.g., for a sensor), it is a rare case that an oxide semiconductor film is used in a state of being exposed to the air. Therefore, it is preferable to evaluate the oxide semiconductor film in a structure as shown in FIG. 2B in which the oxide semiconductor film 56b is sandwiched between the insulating films (i.e., the oxide semiconductor film 56b is not exposed).

Here, as in the oxide semiconductor film 56a, a value obtained by dividing the area of the second curve by the sum of the area of the first curve and the area of the second curve is greater than or equal to 0.1 and less than 1 in the PL spectrum of the oxide semiconductor film 56b. Any of the oxide semiconductor films given as examples of the oxide semiconductor film 56a is used as the oxide semiconductor film 56b.

The insulating film 52 may be formed of a single layer or a stacked layer using an insulating film containing one or more of aluminum oxide, magnesium oxide, silicon oxide, silicon oxynitride, gallium oxide, germanium oxide, yttrium oxide, zirconium oxide, lanthanum oxide, neodymium oxide, hafnium oxide, and tantalum oxide.

Note that, in this specification, the amount of oxygen is larger than that of nitrogen in silicon oxynitride, and the amount of nitrogen is larger than that of oxygen in silicon nitride oxide.

The insulating film 52 is preferably flat. Specifically, the insulating film 52 is made to have an average surface roughness (Ra) of 1 nm or less, 0.3 nm or less, or 0.1 nm or less. Note that Ra is obtained by expanding, into three dimensions, arithmetic mean surface roughness that is defined by JIS B 0601: 2001 (ISO4287:1997) so as to be able to apply it to a curved surface. Ra can be expressed as an "average value of the absolute values of deviations from a reference surface to a specific surface" and is defined by Formula 3.

$$Ra = \frac{1}{S_0} \int_{y1}^{y2} \int_{x1}^{x2} |f(x,y) - Z_0| \, dx \, dy \qquad \text{[FORMULA 3]}$$

Here, the specific surface is a surface which is a target of roughness measurement, and is a quadrilateral region which is specified by four points represented by the coordinates $(x_1, y_1, f(x_1, y_1))$, $(x_2, y_2, f(x_1, y_2))$, $(x_2, y_1, f(x_2, y_1))$, and $(x_2, y_2, f(x_2, y_2))$. Further, $S_0$ represents the area of a rectangle which is obtained by projecting the specific surface on the xy plane, and $Z_0$ represents the height of the reference surface (the average height of the specific surface). Ra can be measured using an atomic force microscope (AFM).

The insulating film 52 is an insulating film containing excess oxygen. Specifically, the insulating film 52 is an insulating film which can release oxygen by being subjected to heat treatment or the like. That is, the insulating film 52 is an insulating film which has a function of releasing oxygen by heat treatment.

Here, to release oxygen by heat treatment means that the amount of released oxygen which is converted into oxygen atoms is greater than or equal to $1 \times 10^{18}$ atoms/cm$^3$, greater than or equal to $1\times10^{19}$ atoms/cm$^3$, or greater than or equal to $1\times10^{20}$ atoms/cm$^3$ in thermal desorption spectroscopy (TDS) analysis.

Here, a method for measuring the amount of released oxygen using TDS analysis will be described.

The total amount of released gas from a measurement sample in TDS analysis is proportional to the integral value of the ion intensity of the released gas. Then, a comparison with a standard sample is made, whereby the total amount of released gas can be calculated.

For example, the number of released oxygen molecules ($N_{O2}$) from the measurement sample can be calculated according to Formula 4 using the TDS analysis results of a silicon wafer containing hydrogen at a predetermined density, which is the standard sample, and the TDS analysis results of the measurement sample. Here, all gases having a mass number of 32 which are obtained in the TDS analysis are assumed to originate from an oxygen molecule. CH$_3$OH, which is given as a gas having a mass number of 32, is not taken into consideration on the assumption that it is unlikely to be present. Further, an oxygen molecule including an oxygen atom having a mass number of 17 or 18 which is an isotope of an oxygen atom is also not taken into consideration because the proportion of such a molecule in the natural world is minimal.

$$N_{O2} = \frac{N_{H2}}{S_{H2}} \times S_{O2} \times \alpha \qquad \text{[FORMULA 4]}$$

$N_{H2}$ is the value obtained by conversion of the number of hydrogen molecules desorbed from the standard sample into densities. $S_{H2}$ is the integral value of ion intensity when the standard sample is analyzed by TDS. Here, the reference value of the standard sample is expressed by $N_{H2}/S_{H2}$. $S_{O2}$ is the integral value of ion intensity when the measurement sample is analyzed by TDS. A coefficient affecting the ion intensity in the TDS analysis is denoted by $\alpha$. Refer to Japanese Published Patent Application No. H06-275697 for details of Formula 4. Note that the amount of released oxygen is measured with a thermal desorption spectroscopy apparatus produced by ESCO Ltd., EMD-WA1000S/W using a silicon wafer containing hydrogen atoms at $1\times10^{16}$ atoms/cm$^2$ as the standard sample.

Further, in the TDS analysis, oxygen is partly detected as an oxygen atom. The ratio between oxygen molecules and oxygen atoms can be calculated from the ionization rate of the oxygen molecules. Note that, since the above $\alpha$ includes the ionization rate of the oxygen molecules, the number of the released oxygen atoms can also be estimated through the evaluation of the number of the released oxygen molecules.

Note that $N_{O2}$ is the number of the released oxygen molecules. The amount of released oxygen converted into oxygen atoms is twice the number of the released oxygen molecules.

Further, to release oxygen by heat treatment means to contain a peroxide radical. Specifically, the spin density attributed to a peroxide radical is higher than or equal to $5\times10^{17}$ spins/cm$^3$. Note that to contain a peroxide radical means to have an asymmetric signal at a g value of around 2.01 in ESR.

The insulating film containing excess oxygen may be formed using oxygen-excess silicon oxide (SiO$_X$ (X>2)). In the oxygen-excess silicon oxide (SiO$_X$(X>2)), the number of oxygen atoms per unit volume is more than twice the number of silicon atoms per unit volume. The number of silicon atoms and the number of oxygen atoms per unit volume are measured by Rutherford backscattering spectrometry (RBS).

An insulating film similar to the insulating film 52 is used as the insulating film 68, and description thereof is omitted.

Further, an insulating film which can transmit light used for low-temperature PL spectroscopy is used as at least one of the insulating film 52 and the insulating film 68.

In low-temperature PL spectroscopy, an oxide semiconductor film is irradiated with light having energy which is larger than the band gap of the oxide semiconductor film so that carriers are generated in the oxide semiconductor film. Accordingly, an insulating film which transmits light having energy which is larger than the band gap of the oxide semiconductor film is used as at least one of the insulating film 52 and the insulating film 68.

In the PL spectrum of the oxide semiconductor film 56b which is obtained by low-temperature PL spectroscopy, a value obtained by dividing the area of the second curve by the sum of the area of the first curve and the area of the second curve is greater than or equal to 0.1 and less than 1. Accordingly, a transistor including the oxide semiconductor film 56b sandwiched between the insulating film 52 and the insulating film 68 can have favorable switching characteristics.

By using the oxide semiconductor film described in this embodiment, a transistor having favorable switching characteristics can be provided.

This embodiment can be implemented in appropriate combination with any of the other embodiments and example.

Embodiment 2

In this embodiment, a transistor according to one embodiment of the present invention will be described.

Figure 3A:
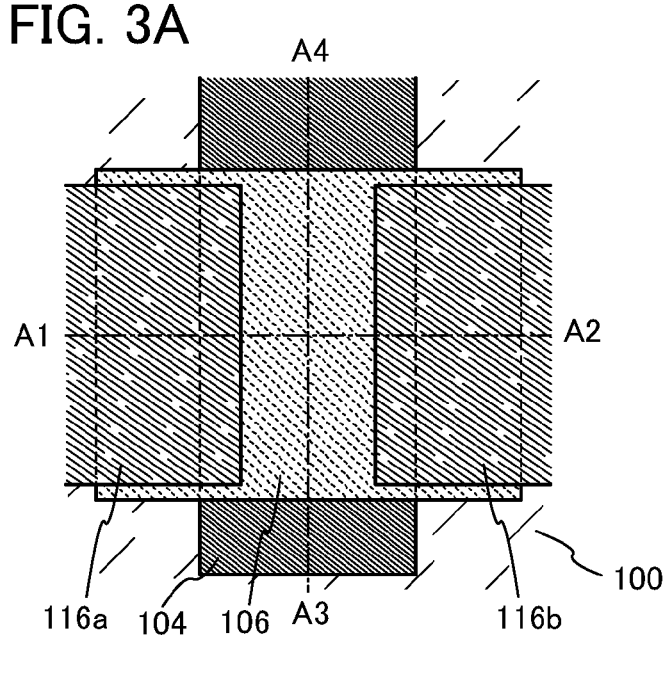
FIGS. 3A to 3C are a top view and cross-sectional views illustrating an example of a transistor according to one embodiment of the present invention.
Figure 3C:
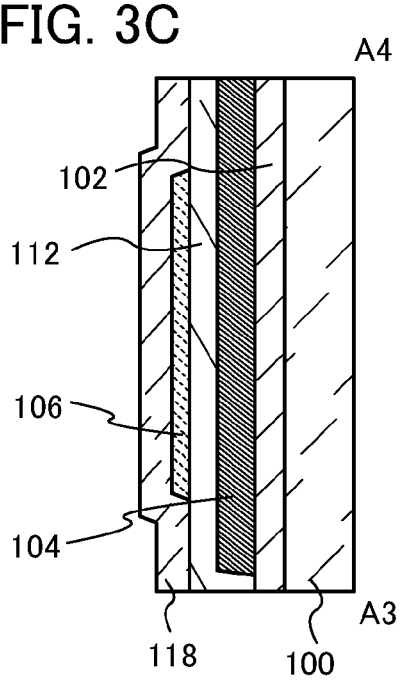
Figure 3B:
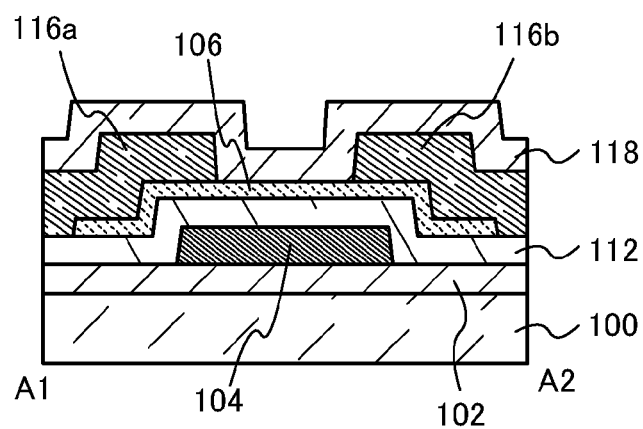

FIG. 3A is a top view of a transistor according to one embodiment of the present invention. FIG. 3B is a cross-sectional view along dashed-dotted line A1-A2 in FIG. 3A. FIG. 3C is a cross-sectional view along dashed-dotted line A3-A4 in FIG. 3A. Note that for simplicity, a gate insulating film 112 and the like are not illustrated in FIG. 3A.

FIG. 3B is a cross-sectional view of a transistor including a base insulating film 102 over a substrate 100, a gate electrode 104 over the base insulating film 102, the gate insulating film 112 over the gate electrode 104, an oxide semiconductor film 106 which is over the gate insulating film 112 and overlaps with the gate electrode 104, a source electrode 116a and a drain electrode 116b which are over the oxide semiconductor film 106, and a protective insulating film 118 over the oxide semiconductor film 106, the source electrode 116a, and the drain electrode 116b. Note that FIG. 3B illustrates a structure including the base insulating film 102; however, one embodiment of the present invention is not limited thereto. For example, a structure without the base insulating film 102 may be employed.

Here, the oxide semiconductor film described in the above embodiment is used as the oxide semiconductor film 106. Specifically, the oxide semiconductor film 106 is an oxide semiconductor film whose PL spectrum obtained by low-temperature PL spectroscopy is divided into two curves as a result of analysis. Here, a value obtained by dividing the area of the second curve by the sum of the area of the first curve and the area of the second curve is greater than or equal to 0.1 and less than 1.

Note that the oxide semiconductor film 106 contains any of indium, gallium, tin, hafnium, and zinc.

The hydrogen concentration in the oxide semiconductor film 106 is set to be lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$. This is because hydrogen included in the oxide semiconductor film 106 sometimes generates unintentional carriers. The generated carriers might increase the off-state current of the transistor and vary the electric characteristics of the transistor. Thus, when the hydrogen concentration in the oxide semiconductor film 106 is in the above range, an increase in the off-state current of the transistor and a change in the electric characteristics of the transistor can be suppressed.

By a significant reduction in the concentration of a donor (e.g., hydrogen or an oxygen vacancy) in the oxide semiconductor film 106, the transistor including the oxide semiconductor film 106 can have an extremely low off-state current. Specifically, the off-state current of a transistor with a channel length of 3 µm and a channel width of 1 µm can be lower than or equal to $1\times10^{-21}$ A or lower than or equal to $1\times10^{-25}$ A.

There is no particular limitation on the substrate 100. For example, a glass substrate, a ceramic substrate, a quartz substrate, a sapphire substrate, or the like may be used as the substrate 100. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used. Still alternatively, any of these substrates provided with a semiconductor element may be used as the substrate 100.

In the case where a large glass substrate such as the 5th generation (1000 mm×1200 mm or 1300 mm×1500 mm), the 6th generation (1500 mm×1800 mm), the 7th generation (1870 mm×2200 mm), the 8th generation (2200 mm×2500 mm), the 9th generation (2400 mm×2800 mm), or the 10th generation (2880 mm×3130 mm) is used as the substrate 100, minute processing is sometimes difficult due to shrinkage of the substrate 100 caused by heat treatment or the like in a manufacturing process of a semiconductor device. Therefore, in the case where the above-described large glass substrate is used as the substrate 100, a substrate which is unlikely to shrink through the heat treatment is preferably used. For example, a large glass substrate whose shrinkage by heat treatment for one hour at 400° C., preferably 450° C., further preferably 500° C. is less than or equal to 10 ppm, preferably less than or equal to 5 ppm, further preferably less than or equal to 3 ppm may be used as the substrate 100.

Further alternatively, a flexible substrate may be used as the substrate 100. Note that as a method for forming a transistor over a flexible substrate, there is a method in which, after a transistor is formed over a non-flexible substrate, the transistor is separated from the non-flexible substrate and transferred to the substrate 100 which is a flexible substrate. In that case, a separation layer is preferably provided between the non-flexible substrate and the transistor.

The base insulating film 102 may be formed of a single layer or a stacked layer using an insulating film containing one or more of aluminum oxide, magnesium oxide, silicon oxide, silicon oxynitride, silicon nitride, silicon nitride oxide, gallium oxide, germanium oxide, yttrium oxide, zirconium oxide, lanthanum oxide, neodymium oxide, hafnium oxide, and tantalum oxide.

The gate electrode 104 may be formed of a single layer or a stacked layer of a simple substance selected from Al, Ti, Cr, Co, Ni, Cu, Y, Zr, Mo, Ag, Ta, and W; a nitride containing one or more kinds of the above substances; an oxide containing one or more kinds of the above substances; or an alloy containing one or more kinds of the above substances.

The source electrode 116a and the drain electrode 116b may be formed of a single layer or a stacked layer of a simple substance selected from Al, Ti, Cr, Co, Ni, Cu, Y, Zr, Mo, Ag, Ta, and W; a nitride containing one or more kinds of the above substances; an oxide containing one or more kinds of the above substances; or an alloy containing one or more kinds of the above substances. Note that the source electrode 116a and the drain electrode 116b may have the same composition or different compositions.

An insulating film similar to the insulating film 52 is used as the gate insulating film 112.

An insulating film similar to the insulating film 68 is used as the protective insulating film 118.

Further, an insulating film which can transmit light used for low-temperature PL spectroscopy is used as at least one of the gate insulating film 112 and the protective insulating film 118. It is preferable to use an insulating film which can transmit light used for low-temperature PL spectroscopy as the protective insulating film 118. The use of an insulating film which can transmit light used for low-temperature PL spectroscopy as the protective insulating film 118 enables evaluation of the oxide semiconductor film 106 in a transistor or a semiconductor device including the transistor by low-temperature PL spectroscopy.

At least one of the gate insulating film 112 and the protective insulating film 118 is preferably an insulating film containing excess oxygen.

In the case where at least one of the gate insulating film 112 and the protective insulating film 118 contains excess oxygen, oxygen vacancies in the oxide semiconductor film 106 can be reduced.

In the PL spectrum of the oxide semiconductor film 106 which is obtained by low-temperature PL spectroscopy, a value obtained by dividing the area of the second curve by the sum of the area of the first curve and the area of the second curve is greater than or equal to 0.1 and less than 1. Accordingly, the transistor illustrated in FIGS. 3A to 3C has favorable switching characteristics.

Figure 4A:
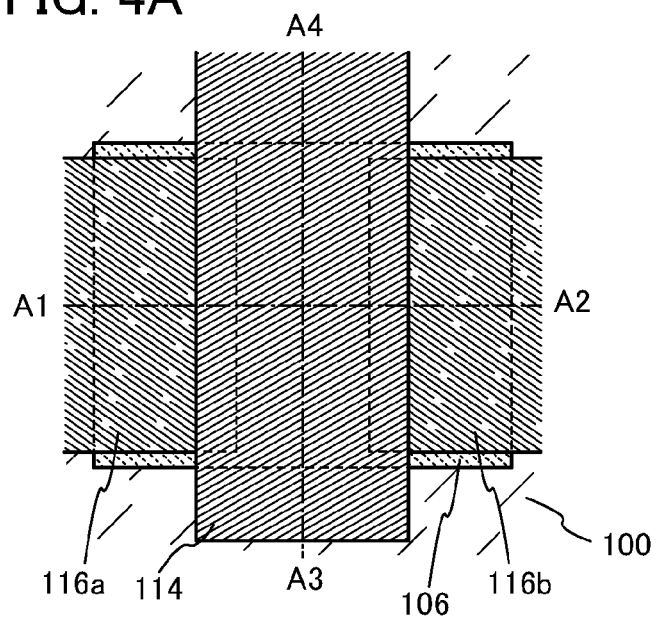
FIGS. 4A to 4C are a top view and cross-sectional views illustrating an example of a transistor according to one embodiment of the present invention.
Figure 4C:
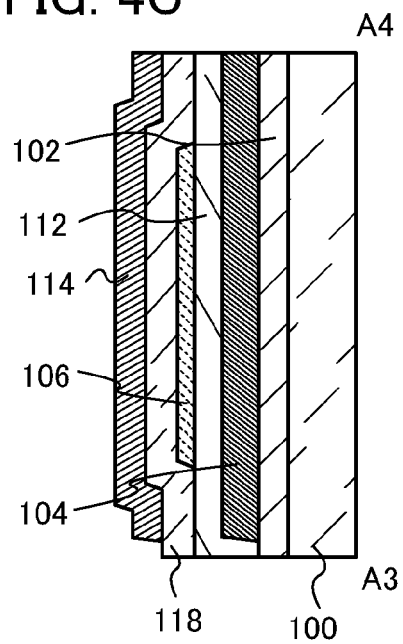
Figure 4B:
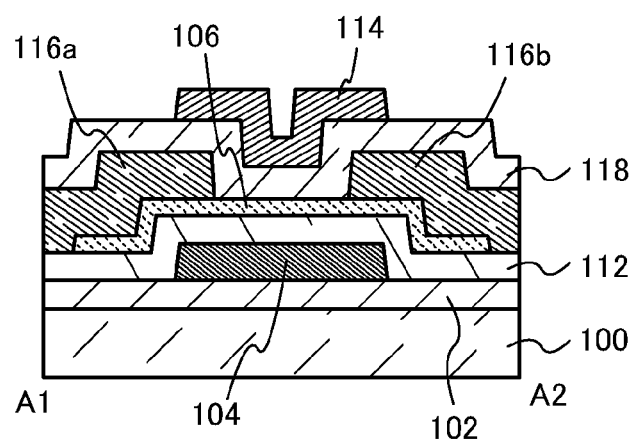

A transistor illustrated in FIGS. 4A to 4C is obtained by additionally providing a back gate electrode 114 in the transistor illustrated in FIGS. 3A to 3C.

FIG. 4A is a top view of a transistor according to one embodiment of the present invention. FIG. 4B is a cross-sectional view along dashed-dotted line A1-A2 in FIG. 4A. FIG. 4C is a cross-sectional view along dashed-dotted line A3-A4 in FIG. 4A. Note that for simplicity, the gate insulating film 112 and the like are not illustrated in FIG. 4A.

The threshold voltage of the transistor illustrated in FIGS. 4A to 4C can be controlled easily owing to the back gate electrode 114. Moreover, the on-state current of the transistor can be increased by electrically connecting the back gate electrode 114 to the gate electrode 104. Alternatively, the off-state current of the transistor can be reduced by setting the potential of the back gate electrode 114 to GND or a negative potential (a potential which is lower than that of the source of the transistor or lower than GND).

Next, a transistor having a structure different from those in FIGS. 3A to 3C and FIGS. 4A to 4C will be described with reference to FIGS. 5A to 5C.

FIG. 5A is a top view of a transistor according to one embodiment of the present invention. FIG. 5B is a cross-sectional view along dashed-dotted line B1-B2 in FIG. 5A. FIG. 5C is a cross-sectional view along dashed-dotted line B3-B4 in FIG. 5A. Note that for simplicity, a gate insulating film 212 and the like are not illustrated in FIG. 5A.

FIG. 5B is a cross-sectional view of a transistor including a base insulating film 202 over a substrate 200, a gate electrode 204 over the base insulating film 202, the gate insulating film 212 over the gate electrode 204, a source electrode 216a and a drain electrode 216b which are over the gate insulating film 212, an oxide semiconductor film 206 which is over the gate insulating film 212, the source electrode 216a, and the drain electrode 216b and overlaps with the gate electrode 204, and a protective insulating film 218 over the oxide semiconductor film 206, the source electrode 216a, and the drain electrode 216b. Note that FIG. 5B illustrates a structure including the base insulating film 202; however, one embodiment of the present invention is not limited thereto. For example, a structure without the base insulating film 202 may be employed.

The description of the oxide semiconductor film 106 is referred to for the oxide semiconductor film 206.

The description of the substrate 100 is referred to for the substrate 200.

The description of the base insulating film 102 is referred to for the base insulating film 202.

The description of the gate electrode 104 is referred to for the gate electrode 204.

An insulating film similar to the insulating film 52 is used as the gate insulating film 212.

The description of the source electrode 116a and the drain electrode 116b is referred to for the source electrode 216a and the drain electrode 216b.

An insulating film similar to the insulating film 68 is used as the protective insulating film 218.

Note that, although not illustrated, a back gate electrode may be provided over the protective insulating film 218 of the transistor illustrated in FIGS. 5A to 5C. The description of the back gate electrode 114 is referred to for the back gate electrode.

Next, a transistor having a structure different from those in FIGS. 3A to 3C, FIGS. 4A to 4C, and FIGS. 5A to 5C will be described with reference to FIGS. 6A to 6C.

Figure 6A:
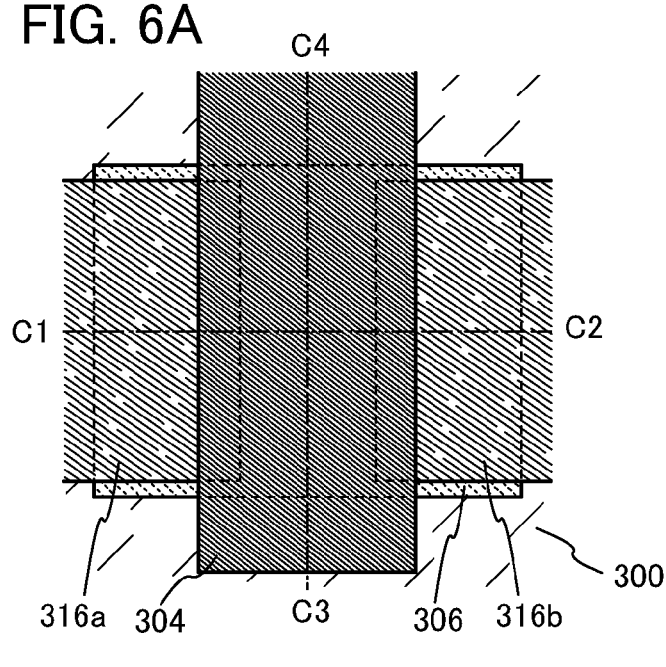
FIGS. 6A to 6C are a top view and cross-sectional views illustrating an example of a transistor according to one embodiment of the present invention.

FIG. 6A is a top view of a transistor according to one embodiment of the present invention. FIG. 6B is a cross-sectional view along dashed-dotted line C1-C2 in FIG. 6A. FIG. 6C is a cross-sectional view along dashed-dotted line C3-C4 in FIG. 6A. Note that for simplicity, a gate insulating film 312 and the like are not illustrated in FIG. 6A.

Figure 6C:
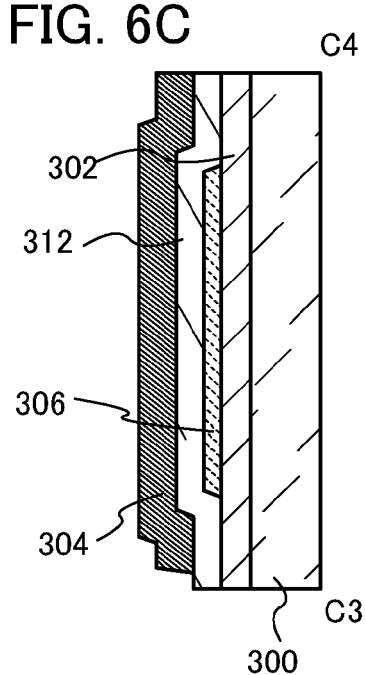
Figure 6B:
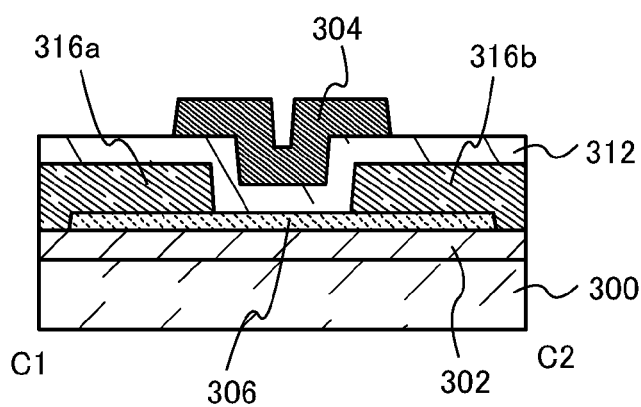

FIG. 6B is a cross-sectional view of a transistor including a base insulating film 302 over a substrate 300; an oxide semiconductor film 306 over the base insulating film 302; a source electrode 316a and a drain electrode 316b which are over the oxide semiconductor film 306; the gate insulating film 312 over the oxide semiconductor film 306, the source electrode 316a, and the drain electrode 316b; and a gate electrode 304 which is over the gate insulating film 312 and overlaps with the oxide semiconductor film 306. Note that FIG. 6B illustrates a structure including the base insulating film 302; however, one embodiment of the present invention is not limited thereto. For example, a structure without the base insulating film 302 may be employed.

The description of the oxide semiconductor film 106 is referred to for the oxide semiconductor film 306.

The description of the substrate 100 is referred to for the substrate 300.

An insulating film similar to the insulating film 52 is used as the base insulating film 302.

The description of the source electrode 116a and the drain electrode 116b is referred to for the source electrode 316a and the drain electrode 316b.

An insulating film similar to the insulating film 68 is used as the gate insulating film 312.

The description of the gate electrode 104 is referred to for the gate electrode 304.

Note that, although not illustrated, a back gate electrode may be provided under the base insulating film 302 of the transistor illustrated in FIGS. 6A to 6C. The description of the back gate electrode 114 is referred to for the back gate electrode.

Next, a transistor having a structure different from those in FIGS. 3A to 3C, FIGS. 4A to 4C, FIGS. 5A to 5C, and FIGS. 6A to 6C will be described with reference to FIGS. 7A to 7C.

Figure 7A:
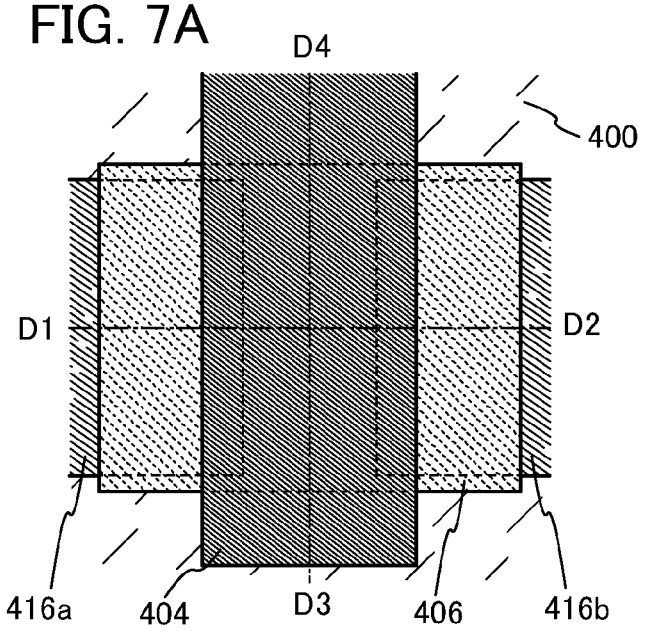
FIGS. 7A to 7C are a top view and cross-sectional views illustrating an example of a transistor according to one embodiment of the present invention.

FIG. 7A is a top view of a transistor according to one embodiment of the present invention. FIG. 7B is a cross-sectional view along dashed-dotted line D1-D2 in FIG. 7A. FIG. 7C is a cross-sectional view along dashed-dotted line D3-D4 in FIG. 7A. Note that for simplicity, a gate insulating film 412 and the like are not illustrated in FIG. 7A.

Figure 7C:
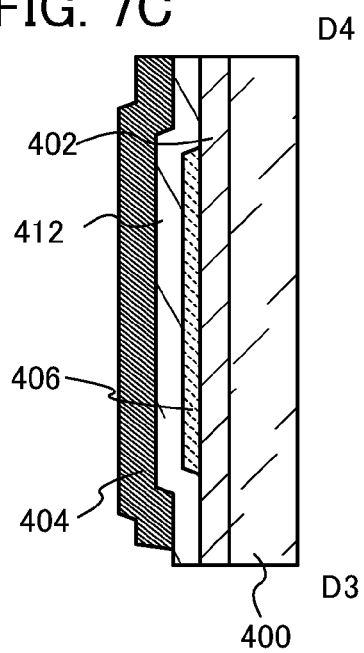
Figure 7B:
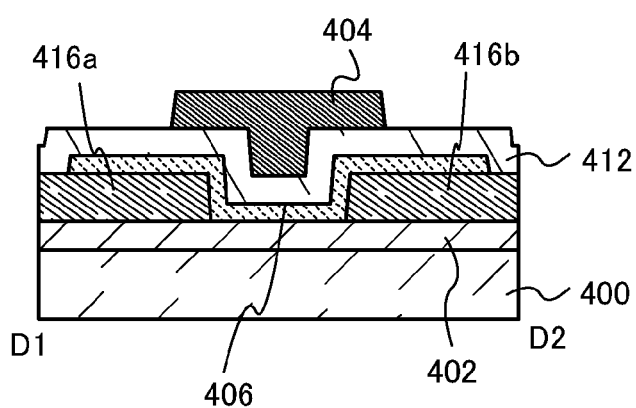

FIG. 7B is a cross-sectional view of a transistor including a base insulating film 402 over a substrate 400; a source electrode 416a and a drain electrode 416b over the base insulating film 402; an oxide semiconductor film 406 over the base insulating film 402, the source electrode 416a, and the drain electrode 416b; the gate insulating film 412 over the oxide semiconductor film 406; and a gate electrode 404 which is over the gate insulating film 412 and overlaps with the oxide semiconductor film 406. Note that FIG. 7B illustrates a structure including the base insulating film 402; however, one embodiment of the present invention is not limited thereto. For example, a structure without the base insulating film 402 may be employed.

The description of the oxide semiconductor film 106 is referred to for the oxide semiconductor film 406.

The description of the substrate 100 is referred to for the substrate 400.

An insulating film similar to the insulating film 52 is used as the base insulating film 402.

The description of the source electrode 116a and the drain electrode 116b is referred to for the source electrode 416a and the drain electrode 416b.

An insulating film similar to the insulating film 68 is used as the gate insulating film 412.

The description of the gate electrode 104 is referred to for the gate electrode 404.

Note that, although not illustrated, a back gate electrode may be provided under the base insulating film 402 of the transistor illustrated in FIGS. 7A to 7C. The description of the back gate electrode 114 is referred to for the back gate electrode.

Next, a transistor having a structure different from those in FIGS. 3A to 3C, FIGS. 4A to 4C, FIGS. 5A to 5C, FIGS. 6A to 6C, and FIGS. 7A to 7C will be described with reference to FIGS. 8A to 8C.

Figure 8A:
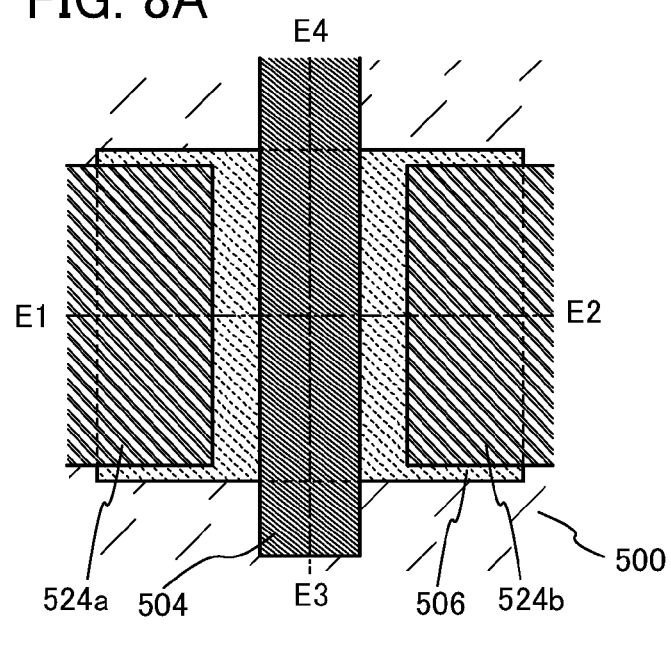
FIGS. 8A to 8C are a top view and cross-sectional views illustrating an example of a transistor according to one embodiment of the present invention.

FIG. 8A is a top view of a transistor according to one embodiment of the present invention. FIG. 8B is a cross-sectional view along dashed-dotted line E1-E2 in FIG. 8A. FIG. 8C is a cross-sectional view along dashed-dotted line E3-E4 in FIG. 8A. Note that for simplicity, a gate insulating film 512 and the like are not illustrated in FIG. 8A.

Figure 8C:
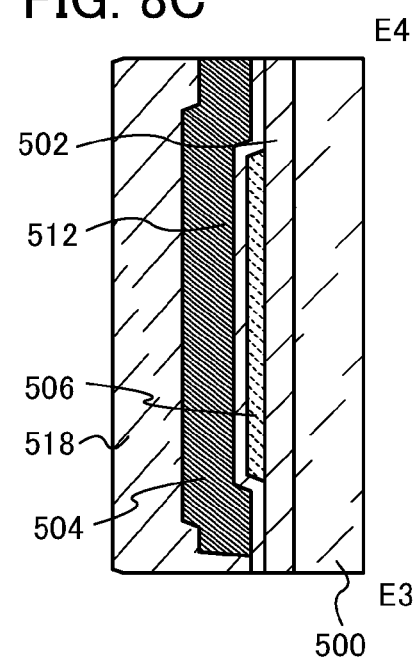
Figure 8B:
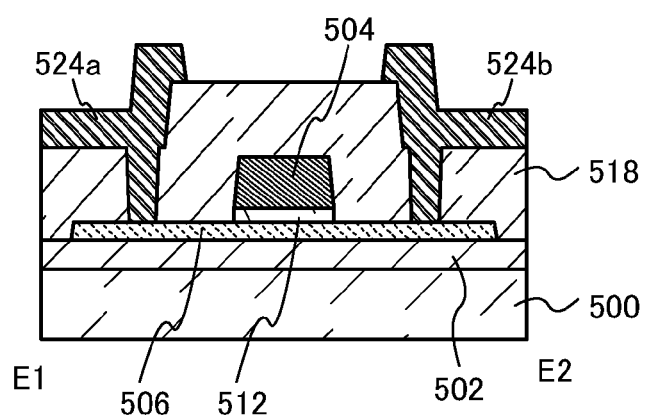

FIG. 8B is a cross-sectional view of a transistor including a base insulating film 502 over a substrate 500; an oxide semiconductor film 506 over the base insulating film 502; the gate insulating film 512 over the oxide semiconductor film 506; a gate electrode 504 which is over the gate insulating film 512 and overlaps with the oxide semiconductor film 506; and an interlayer insulating film 518 over the oxide semiconductor film 506 and the gate electrode 504. Note that FIG. 8B illustrates a structure including the base insulating film 502; however, one embodiment of the present invention is not limited thereto. For example, a structure without the base insulating film 502 may be employed.

In the cross-sectional view in FIG. 8B, openings reaching the oxide semiconductor film 506 are formed in the interlayer insulating film 518, and a wiring 524a and a wiring 524b provided over the interlayer insulating film 518 are in contact with the oxide semiconductor film 506 through the openings.

Note that although the gate insulating film 512 is provided only in a region overlapping with the gate electrode 504 in FIG. 8B, one embodiment of the present invention is not limited to this structure. For example, the gate insulating film 512 may be provided so as to cover the oxide semiconductor film 506. Alternatively, a sidewall insulating film may be provided in contact with a side surface of the gate electrode 504.

In the case of providing the sidewall insulating film in contact with the side surface of the gate electrode 504, it is preferred that, in the oxide semiconductor film 506, a region overlapping with the sidewall insulating film have lower resistance than a region overlapping with the gate electrode 504. For example, in the oxide semiconductor film 506, a region not overlapping with the gate electrode 504 may contain an impurity that reduces the resistance of the oxide semiconductor film 506. Alternatively, the resistance of the region may be reduced by defects. In the oxide semiconductor film 506, the region overlapping with the sidewall insulating film has lower resistance than the region overlapping with the gate electrode 504; thus, the region serves as a lightly doped drain (LDD) region. With the LDD regions of the transistor, drain induced barrier lowering (DIBL) and hot-carrier degradation can be suppressed. Note that in the oxide semiconductor film 506, the region overlapping with the sidewall insulating film may serve also as an offset region. Also with the offset region of the transistor, DIBL and hot-carrier degradation can be suppressed.

The description of the oxide semiconductor film 106 is referred to for the oxide semiconductor film 506.

The description of the substrate 100 is referred to for the substrate 500.

An insulating film similar to the insulating film 52 is used as the base insulating film 502.

An insulating film similar to the insulating film 68 is used as the gate insulating film 512.

The description of the gate electrode 104 is referred to for the gate electrode 504.

The interlayer insulating film 518 may be formed of a single layer or a stacked layer using an insulating film containing one or more of aluminum oxide, magnesium oxide, silicon oxide, silicon oxynitride, gallium oxide, germanium oxide, yttrium oxide, zirconium oxide, lanthanum oxide, neodymium oxide, hafnium oxide, and tantalum oxide.

The wiring 524a and the wiring 524b may be formed of a single layer or a stacked layer of a simple substance selected from Al, Ti, Cr, Co, Ni, Cu, Y, Zr, Mo, Ag, Ta, and W; a nitride containing one or more kinds of the above substances; an oxide containing one or more kinds of the above substances; or an alloy containing one or more kinds of the above substances. Note that the wiring 524a and the wiring 524b may have the same composition or different compositions.

Note that, although not illustrated, a back gate electrode may be provided under the base insulating film 502 of the transistor illustrated in FIGS. 8A to 8C. The description of the back gate electrode 114 is referred to for the back gate electrode.

In the transistor illustrated in FIGS. 8A to 8C, a region where the gate electrode 504 overlaps with another wiring and electrode is small; therefore, parasitic capacitance is unlikely to be generated. Accordingly, the switching characteristics of the transistor can be enhanced. Moreover, the channel length of the transistor is determined by the width of the gate electrode 504; therefore, a miniaturized transistor having a short channel length is manufactured easily.

The transistors illustrated in FIGS. 3A to 3C, FIGS. 4A to 4C, FIGS. 5A to 5C, FIGS. 6A to 6C, FIGS. 7A to 7C, and FIGS. 8A to 8C include an oxide semiconductor film which satisfies the following: in the PL spectrum of the oxide semiconductor film which is obtained by low-temperature PL spectroscopy, a value obtained by dividing the area of the second curve by the sum of the area of the first curve and the area of the second curve is greater than or equal to 0.1 and less than 1. Accordingly, the transistors have favorable switching characteristics.

This embodiment can be implemented in appropriate combination with any of the other embodiments and example.

Embodiment 3

In this embodiment, a logic circuit which is a semiconductor device according to one embodiment of the present invention is described.

Figure 9A:
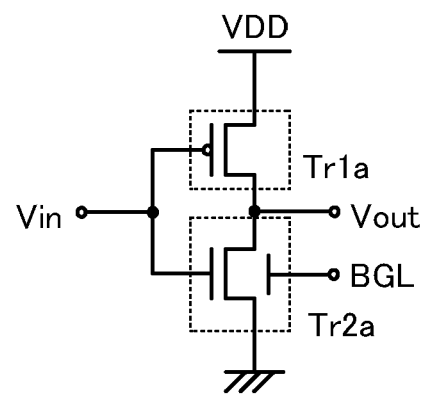
FIG. 9A is a circuit diagram of a semiconductor device according to one embodiment of the present invention.

FIG. 9A is a circuit diagram illustrating an example of a NOT circuit (inverter) using a p-channel transistor and an n-channel transistor.

A transistor Tr1a which is a p-channel transistor may be, for example, a transistor including silicon. Note that the transistor Tr1a is not limited to a transistor including silicon. The threshold voltage of the transistor Tr1a is denoted by Vth1a.

A transistor Tr2a which is an n-channel transistor may be, for example, the transistor described in the above embodiment. The threshold voltage of the transistor Tr2a is denoted by Vth2a.

Here, a gate of the transistor Tr1a is connected to an input terminal Vin and a gate of the transistor Tr2a. A source of the transistor Tr1a is electrically connected to a power supply potential (VDD). A drain of the transistor Tr1a is connected to a drain of the transistor Tr2a and an output terminal Vout. A source of the transistor Tr2a is connected to a ground potential (GND). A back gate of the transistor Tr2a is connected to a back gate line BGL. In this embodiment, the transistor Tr2a has a back gate; however, one embodiment of the present invention is not limited thereto. For example, it is also possible to employ a structure in which the transistor Tr2a does not have a back gate or a structure in which the transistor Tr1a has a back gate.

For example, the threshold voltage Vth1a of the transistor Tr1a is higher than VDD with an inverted sign and lower than 0 V (−VDD<Vth1a<0 V). Further, the threshold voltage Vth2a of the transistor Tr2a is higher than 0 V and lower than VDD (0 V<Vth2a<VDD). Note that a back gate may be used for control of the threshold voltage of each transistor.

Here, when the potential of the input terminal Vin is set to VDD, the gate voltage of the transistor Tr1a becomes 0 V, so that the transistor Tr1a is turned off. Further, the gate voltage of the transistor Tr2a becomes VDD, so that the transistor Tr2a is turned on. Accordingly, the output terminal Vout is electrically connected to GND and supplied with GND.

When the potential of the input terminal Vin is set to GND, the gate voltage of the transistor Tr1a becomes VDD, so that the transistor Tr1a is turned on. Further, the gate voltage of the transistor Tr2a becomes 0 V, so that the transistor Tr2a is turned off. Accordingly, the output terminal Vout is electrically connected to VDD and supplied with VDD.

As described above, in the circuit diagram of FIG. 9A, GND is output from the output terminal Vout when the potential of the input terminal Vin is VDD, and VDD is output from the output terminal Vout when the potential of the input terminal Vin is GND.

Figure 9B:
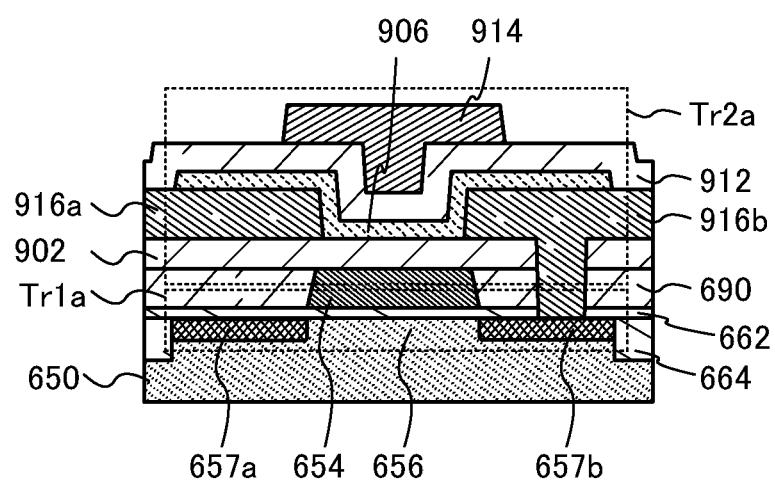
FIG. 9B is a cross-sectional view thereof.

FIG. 9B is an example of a cross-sectional view of a semiconductor device corresponding to FIG. 9A.

FIG. 9B is a cross-sectional view of the semiconductor device including the transistor Tr1a, an insulating film 902 provided over the transistor Tr1a, and the transistor Tr2a provided over the insulating film 902.

The insulating film 902 may be formed of a single layer or a stacked layer using an insulating film containing one or more of aluminum oxide, magnesium oxide, silicon oxide, silicon oxynitride, gallium oxide, germanium oxide, yttrium oxide, zirconium oxide, lanthanum oxide, neodymium oxide, hafnium oxide, and tantalum oxide.

In FIG. 9B, a transistor similar to the transistor illustrated in FIGS. 7A to 7C is used as the transistor Tr2a. Therefore, for components of the transistor Tr2a which are not particularly described below, refer to the description on FIGS. 7A to 7C.

Here, the transistor Tr1a includes a semiconductor substrate 650, a channel region 656, a source region 657a, and a drain region 657b which are provided in the semiconductor substrate 650, an element isolation layer 664 which fills a groove portion provided in the semiconductor substrate 650, a gate insulating film 662 provided over the semiconductor substrate 650, and a gate electrode 654 provided over the channel region 656 with the gate insulating film 662 therebetween.

A single crystal semiconductor substrate or a polycrystalline semiconductor substrate of silicon, silicon carbide, or the like or a compound semiconductor substrate of silicon germanium or the like may be used as the semiconductor substrate 650.

In this embodiment, the transistor Tr1a is provided in a semiconductor substrate; however, one embodiment of the present invention is not limited thereto. For example, a structure may be employed in which a substrate having an insulating surface is used instead of the semiconductor substrate and a semiconductor film is provided on the insulating surface. Here, a glass substrate, a ceramic substrate, a quartz substrate, or a sapphire substrate may be used as the substrate having an insulating surface, for example.

The source region 657a and the drain region 657b include an impurity which makes the semiconductor substrate 650 have p-type conductivity.

The element isolation layer 664 may be formed of a single layer or a stacked layer using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The gate insulating film 662 may be formed of a single layer or a stacked layer using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The gate electrode 654 may be formed of a single layer or a stacked layer of a simple substance selected from Al, Ti, Cr, Co, Ni, Cu, Y, Zr, Mo, Ag, Ta, and W; a nitride containing one or more kinds of the above substances; an oxide containing one or more kinds of the above substances; or an alloy containing one or more kinds of the above substances.

The gate electrode 654 functions not only as the gate electrode of the transistor Tr1a, but also as the gate electrode of the transistor Tr2a. Accordingly, the insulating film 902 functions as the gate insulating film of the transistor Tr2a.

The description of the source electrode 416a and the drain electrode 416b of the transistor illustrated in FIGS. 7A to 7C is referred to for a source electrode 916a and a drain electrode 916b of the transistor Tr2a.

The description of the oxide semiconductor film 406 of the transistor illustrated in FIGS. 7A to 7C is referred to for an oxide semiconductor film 906 of the transistor Tr2a.

The description of the gate insulating film 412 of the transistor illustrated in FIGS. 7A to 7C is referred to for a gate insulating film 912 of the transistor Tr2a.

The description of the gate electrode 404 of the transistor illustrated in FIGS. 7A to 7C is referred to for a gate electrode 914 of the transistor Tr2a. Note that the gate electrode 914 functions as a back gate electrode of the transistor Tr2a.

In the semiconductor device illustrated in FIG. 9B, an insulating film 690 whose top surface is aligned with the top surface of the gate electrode 654 is provided. Note that a structure without the insulating film 690 may be employed.

The insulating film 690 may be formed of a single layer or a stacked layer using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

An opening reaching the drain region 657b of the transistor Tr1a is provided in the insulating film 690 and the insulating film 902. The drain electrode 916b of the transistor Tr2a is in contact with the drain region 657b of the transistor Tr1a through the opening.

By applying the transistor described in the above embodiment to the transistor Tr2a, a flow-through current when the transistor Tr2a is off can be significantly reduced because the transistor Tr2a has an extremely low off-state current. Thus, an inverter with low power consumption is achieved.

Figure 10A:
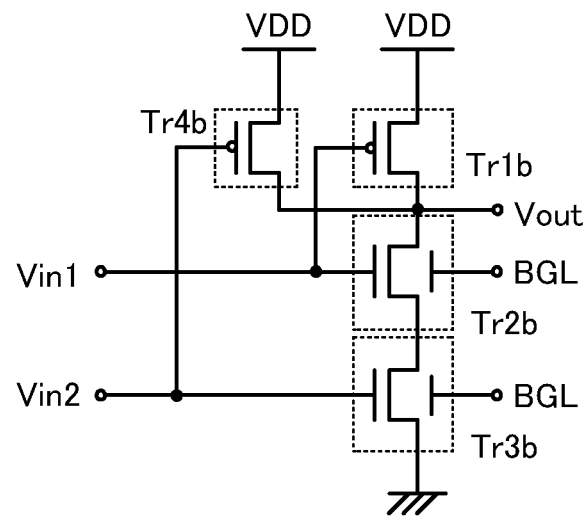
FIGS. 10A and 10B are circuit diagrams of semiconductor devices according to one embodiment of the present invention.

Note that the inverters illustrated in FIG. 9A may be combined to form a NAND circuit illustrated in FIG. 10A. The circuit diagram of FIG. 10A includes a transistor Tr1b and a transistor Tr4b which are p-channel transistors, and a transistor Tr2b and a transistor Tr3b which are n-channel transistors. The transistors Tr1b and Tr4b may each be, for example, a transistor including silicon. The transistors Tr2b and Tr3b may each be the transistor including an oxide semiconductor film described in the above embodiment.

Figure 10B:
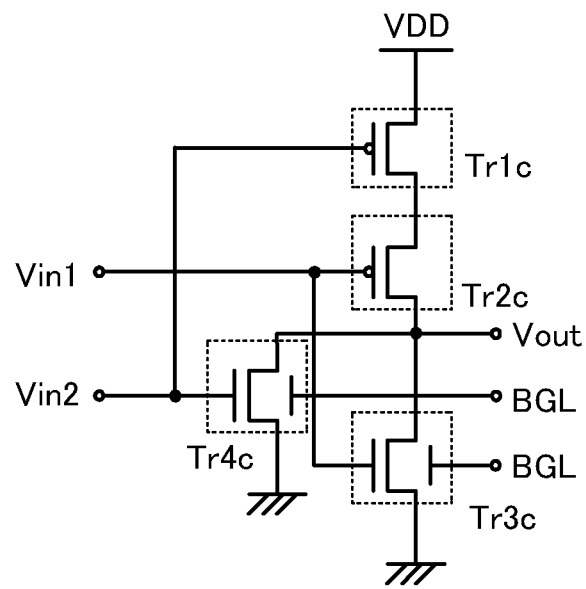

The inverter illustrated in FIG. 9A may be combined to form a NOR circuit illustrated in FIG. 10B. The circuit diagram of FIG. 10B includes a transistor Tr1c and a transistor Tr2c which are p-channel transistors, and a transistor Tr3c and a transistor Tr4c which are n-channel transistors. The transistors Tr1c and Tr2c may each be, for example, a transistor including silicon. The transistors Tr3c and Tr4c may each be the transistor including an oxide semiconductor film described in the above embodiment.

Figure 11A:
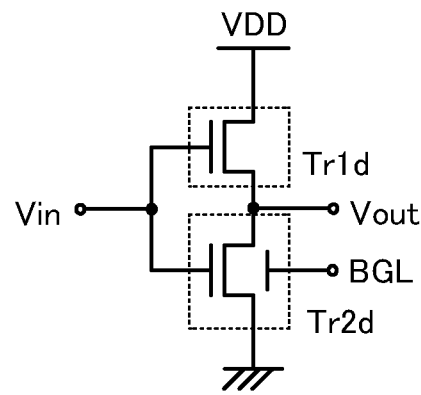
FIG. 11A is a circuit diagram of a semiconductor device according to one embodiment of the present invention.

The aforementioned examples of logic circuits are configured with the inverters using p-channel transistors and n-channel transistors; a logic circuit may be configured with an inverter using only n-channel transistors. FIG. 11A illustrates an example of such a case.

The circuit diagram of FIG. 11A includes a transistor Tr1d which is a depletion transistor and a transistor Tr2d which is an enhancement transistor.

The depletion transistor Tr1d may be, for example, a transistor including an oxide semiconductor film. Note that the transistor Tr1d is not limited to a transistor including an oxide semiconductor film, and may be, for example, a transistor including silicon. The threshold voltage of the transistor Tr1d is denoted by Vth1d. A resistor with a sufficiently low resistance may be provided instead of the depletion transistor.

The enhancement transistor Tr2d may be, for example, the transistor including an oxide semiconductor film described in the above embodiment. The threshold voltage of the transistor Tr2d is denoted by Vth2d.

Note that the transistor including an oxide semiconductor film described in the above embodiment may be used as the transistor Tr1d. In that case, a transistor other than the transistor including an oxide semiconductor film described in the above embodiment may be used as the transistor Tr2d.

Here, a gate of the transistor Tr1d is connected to an input terminal Vin and a gate of the transistor Tr2d. A drain of the transistor Tr1d is electrically connected to VDD. A source of the transistor Tr1d is connected to a drain of the transistor Tr2d and an output terminal Vout. A source of the transistor Tr2d is connected to GND. A back gate of the transistor Tr2d is connected to a back gate line BGL. In this embodiment, the transistor Tr2d has a back gate; however, one embodiment of the present invention is not limited thereto. For example, it is also possible to employ a structure in which the transistor Tr2d does not have a back gate or a structure in which the transistor Tr1d has a back gate.

The threshold voltage Vth1d of the transistor Tr1d is, for example, lower than 0 V (Vth1d<0 V). Accordingly, the transistor Tr1d is on regardless of the gate voltage, that is, the transistor Tr1d functions as a resistor having a sufficiently low resistance. Further, the threshold voltage Vth2d of the transistor Tr2d is higher than 0 V and lower than VDD (0 V<Vth2d<VDD). Note that a back gate may be used for control of the threshold voltage of each transistor. Further, a resistor having a sufficiently low resistance may be provided instead of the transistor Tr1d.

Here, when the potential of the input terminal Vin is set to VDD, the gate voltage of the transistor Tr2d becomes VDD, so that the transistor Tr2d is turned on. Accordingly, the output terminal Vout is electrically connected to GND and supplied with GND.

Further, when the potential of the input terminal Vin is set to GND, the gate voltage of the transistor Tr2d becomes 0 V, so that the transistor Tr2d is turned off. Accordingly, the output terminal Vout is electrically connected to VDD and supplied with VDD. Note that strictly, the potential output from the output terminal Vout is equal to a potential dropped from VDD by the resistance of the transistor Tr1d. However, the effect of the voltage drop can be ignored because the resistance of the transistor Tr1d is sufficiently low.

As described above, in the circuit diagram of FIG. 11A, when the potential of the input terminal Vin is VDD, GND is output from the output terminal Vout, and when the potential of the input terminal Vin is GND, VDD is output from the output terminal Vout.

Note that the transistor Tr1d and the transistor Tr2d may be manufactured in the same plane, which facilitates the production of the inverter. At this time, a back gate is preferably provided in at least one of the transistors Tr1d and Tr2d. In the case where the manufactured transistors are depletion transistors, the threshold voltage Vth2d may be set within the above range by the back gate of the transistor Tr2d. In the case where the manufactured transistors are enhancement transistors, the threshold voltage Vth1d may be set within the above range by the back gate of the transistor Tr1d. Note that the threshold voltages of the transistors Tr1d and Tr2d may be controlled by different back gates.

Alternatively, the transistor Tr1d and the transistor Tr2d may be overlapped with each other, in which case the inverter can be reduced in area.

Figure 11B:
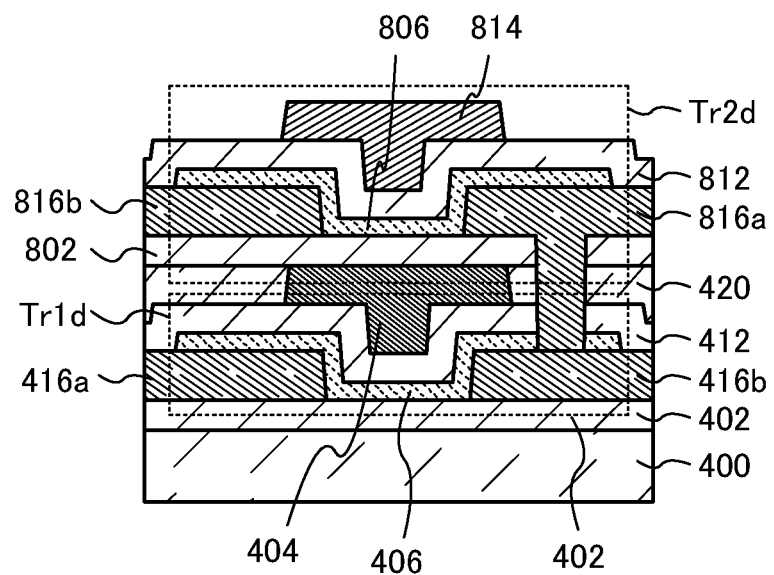
FIG. 11B is a cross-sectional view thereof.

FIG. 11B is an example of a cross-sectional view of a semiconductor device in which the transistor Tr1d and the transistor Tr2d are overlapped with each other.

The description of the transistor illustrated in FIGS. 7A to 7C is referred to for the transistor Tr1d in FIG. 11B. Further, a transistor similar to the transistor illustrated in FIGS. 7A to 7C is used as the transistor Tr2d. Therefore, for components of the transistor Tr2d which are not particularly described below, refer to the description on FIGS. 7A to 7C.

Note that the transistor Tr1d includes the base insulating film 402 over the substrate 400; the source electrode 416a and the drain electrode 416b over the base insulating film 402; the oxide semiconductor film 406 over the base insulating film 402, the source electrode 416a, and the drain electrode 416b; the gate insulating film 412 over the oxide semiconductor film 406; and the gate electrode 404 which is over the gate insulating film 412 and overlaps with the oxide semiconductor film 406.

The gate electrode 404 functions not only as the gate electrode of the transistor Tr1d, but also as the gate electrode of the transistor Tr2d. Accordingly, the insulating film 802 functions as the gate insulating film of the transistor Tr2d.

The description of the source electrode 416a and the drain electrode 416b of the transistor illustrated in FIGS. 7A to 7C is referred to for a source electrode 816a and a drain electrode 816b of the transistor Tr2d.

The description of the oxide semiconductor film 406 of the transistor illustrated in FIGS. 7A to 7C is referred to for an oxide semiconductor film 806 of the transistor Tr2d.

The description of the gate insulating film 412 of the transistor illustrated in FIGS. 7A to 7C is referred to for a gate insulating film 812 of the transistor Tr2d.

The description of the gate electrode 404 of the transistor illustrated in FIGS. 7A to 7C is referred to for a gate electrode 814 of the transistor Tr2d. Note that the gate electrode 814 functions as a back gate electrode of the transistor Tr2d.

In the semiconductor device illustrated in FIG. 11B, an insulating film 420 whose top surface is aligned with the top surface of the gate electrode 404 is provided. Note that a structure without the insulating film 420 may be employed.

The insulating film 420 may be formed of a single layer or a stacked layer using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

An opening reaching the drain electrode 416b of the transistor Tr1d is provided in the insulating film 420, the insulating film 802, and the oxide semiconductor film 406. The source electrode 816a of the transistor Tr2d is in contact with the drain electrode 416b of the transistor Tr1d through the opening.

By applying the transistor described in the above embodiment to the transistor Tr2d, a flow-through current when the transistor Tr2d is off can be significantly reduced because the transistor Tr2d has an extremely low off-state current. Thus, an inverter with low power consumption is achieved.

This embodiment can be implemented in appropriate combination with any of the other embodiments and example.

Embodiment 4

In this embodiment, a static random access memory (SRAM) will be described, the SRAM being a semiconductor device including a flip-flop which is obtained by applying the inverter circuit shown in Embodiment 3.

In the SRAM, data is retained using a flip-flop; therefore, unlike in a dynamic random access memory (DRAM), refresh operation is not necessary and thus data can be retained with less power. In addition, the SRAM does not use a capacitor and thus is suitable for application requiring high-speed operation.

Figure 12:
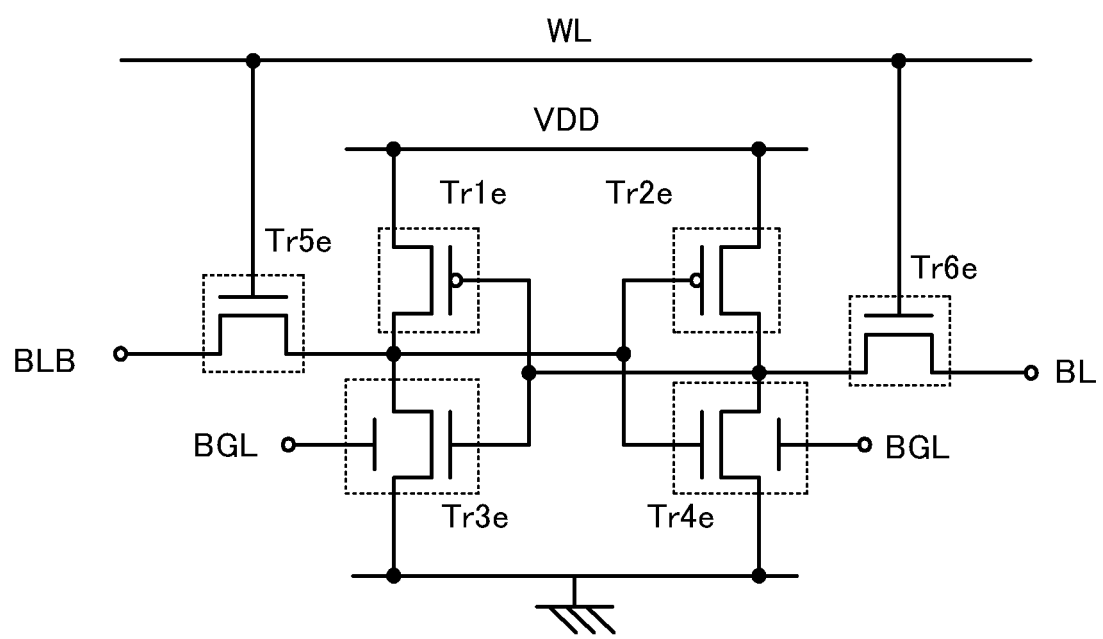
FIG. 12 is a circuit diagram of a semiconductor device according to one embodiment of the present invention.

FIG. 12 is a circuit diagram equivalent to a memory cell of an SRAM of one embodiment of the present invention. Although only one memory cell is illustrated in FIG. 12, one embodiment of the present invention may be applied to a memory cell array including a plurality of the memory cells.

The memory cell illustrated in FIG. 12 includes a transistor Tr1e, a transistor Tr2e, a transistor Tr3e, a transistor Tr4e, a transistor Tr5e, and a transistor Tr6e. The transistors Tr1e and Tr2e are p-channel transistors, and the transistors Tr3e and Tr4e are n-channel transistors. A gate of the transistor Tr1e is electrically connected to a drain of the transistor Tr2e, a gate of the transistor Tr3e, a drain of the transistor Tr4e, and one of a source and a drain of the transistor Tr6e. A source of the transistor Tr1e is electrically connected to VDD. A drain of the transistor Tr1e is electrically connected to a gate of the transistor Tr2e, a gate of the transistor Tr4e, a drain of the transistor Tr3e, and one of a source and a drain of the transistor Tr5e. A source of the transistor Tr2e is electrically connected to VDD. A source of the transistor Tr3e is electrically connected to GND. A back gate of the transistor Tr3e is electrically connected to a back gate line BGL. A source of the transistor Tr4e is electrically connected to GND. A back gate of the transistor Tr4e is electrically connected to a back gate line BGL. A gate of the transistor Tr5e is electrically connected to the word line WL. The other of the source and the drain of the transistor Tr5e is electrically connected to a bit line BLB. A gate of the transistor Tr6e is electrically connected to the word line WL. The other of the source and the drain of the transistor Tr6e is electrically connected to a bit line BL.

Note that this embodiment shows an example where n-channel transistors are used as the transistors Tr5e and Tr6e. However, the transistors Tr5e and Tr6e are not limited to n-channel transistors and may be p-channel transistors. In that case, writing, retaining, and reading methods described below may be changed as appropriate.

A flip-flop is thus configured in such a manner that an inverter including the transistors Tr1e and Tr3e and an inverter including the transistors Tr2e and Tr4e are connected in a ring.

The p-channel transistors may be, but are not limited to, transistors including silicon for example. The n-channel transistors may each be the transistor including an oxide semiconductor film described in the above embodiment.

In this embodiment, the transistors Tr3e and Tr4e may each be the transistor including an oxide semiconductor film described in the above embodiment. With an extremely low off-state current, the transistor has an extremely low flow-through current.

Note that instead of the p-channel transistors, n-channel transistors may be applied to the transistors Tr1e and Tr2e. In the case where n-channel transistors are used as the transistors Tr1e and Tr2e, depletion transistors may be employed as described with reference to FIGS. 11A and 11B.

Writing, retaining, and reading operation of the memory cell illustrated in FIG. 12 will be described below.

In writing, first, potentials corresponding to data 0 or data 1 are applied to the bit line BL and the bit line BLB.

For example, in the case where data 1 is to be written, the VDD is applied to the bit line BL and the GND is applied to the bit line BLB. Then, a potential (VH) higher than or equal to the sum of the VDD and the threshold voltage of the transistors Tr5e and Tr6e is applied to the word line WL.

Next, the potential of the word line WL is set to be lower than the threshold voltage of the transistors Tr5e and Tr6e, whereby the data 1 written to the flip-flop is retained. In the case of the SRAM, a current flowing in retaining data is only the leakage current of the transistors. Here, any of the transistors including an oxide semiconductor film described in the above embodiment, which has an extremely low off-state current, is applied to some of the transistors in the SRAM, resulting in a reduction in stand-by power for retaining data because leakage current due to the transistor is extremely low.

In reading, the VDD is applied to the bit line BL and the bit line BLB in advance. Then, the VH is applied to the word line WL, so that the potential of the bit line BLB is discharged through the transistors Tr5e and Tr3e to be equal to the GND while the potential of the bit line BL is kept at VDD. The potential difference between the bit line BL and the bit line BLB is amplified by a sense amplifier (not illustrated), whereby the retained data 1 can be read.

In the case where data 0 is to be written, the GND is applied to the bit line BL and the VDD is applied to the bit line BLB; then, the VH is applied to the word line WL. Next, the potential of the word line WL is set to be lower than the threshold voltage of the transistors Tr5e and Tr6e, whereby the data 0 written to the flip-flop is retained. In reading, the VDD is applied to the bit line BL and the bit line BLB in advance. Then, the VH is applied to the word line WL, so that the potential of the bit line BL is discharged through the transistors Tr6e and Tr4e to be equal to the GND while the potential of the bit line BLB is kept at VDD. The potential difference between the bit line BL and the bit line BLB is amplified by the sense amplifier, whereby the retained data 0 can be read.

According to this embodiment, an SRAM with low stand-by power can be provided.

This embodiment can be implemented in appropriate combination with any of the other embodiments and example.

Embodiment 5

The transistors including an oxide semiconductor film described in the above embodiment can have extremely low off-state current. That is, the transistor has electrical characteristics in which leakage of charge through the transistor is unlikely to occur.

A semiconductor device which includes a transistor having such electric characteristics will be described below. The semiconductor device includes a memory element which is superior in function to a known memory element.

Figure 13A:
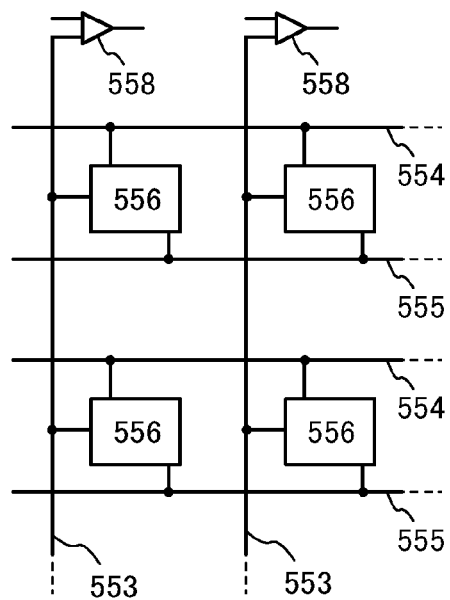
FIGS. 13A to 13D are circuit diagrams and a cross-sectional view illustrating a semiconductor device according to one embodiment of the present invention, and a graph showing electrical characteristics thereof.
Figure 13B:
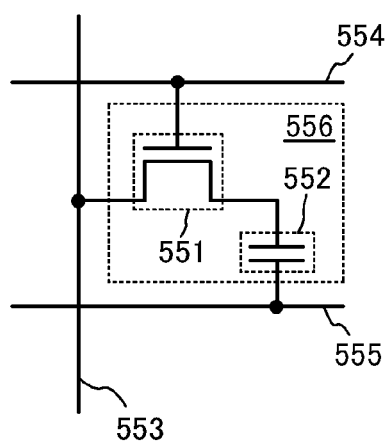
Figure 13C:
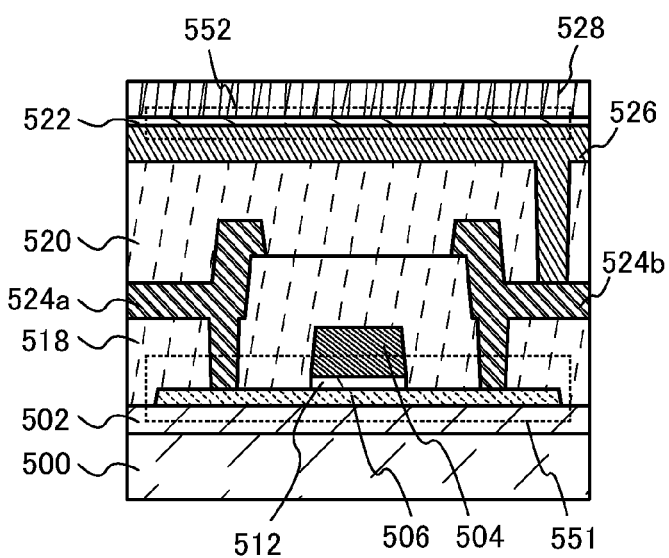
Figure 13D:
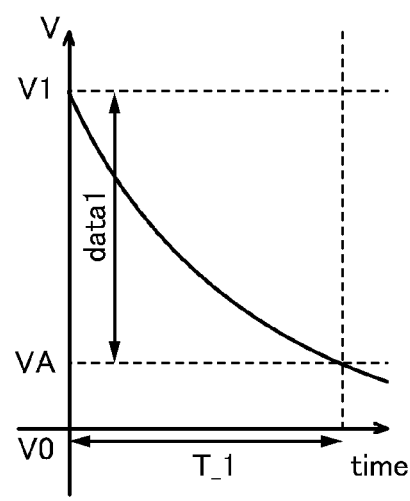

First, the semiconductor device will be specifically described with reference to FIGS. 13A to 13D. FIG. 13A is a circuit diagram showing a memory cell array of the semiconductor device. FIG. 13B is a circuit diagram of a memory cell. FIG. 13C illustrates an example of a cross-sectional structure corresponding to the memory cell in FIG. 13B. FIG. 13D is a graph showing the electric characteristics of the memory cell in FIG. 13B.

The memory cell array in FIG. 13A includes a plurality of memory cells 556, a plurality of bit lines 553, a plurality of word lines 554, a plurality of capacitor lines 555, and a plurality of sense amplifiers 558.

Note that the bit lines 553 and the word lines 554 are provided in a grid pattern, and the memory cell 556 is provided for each intersection of the bit line 553 and the word line 554. The bit lines 553 are connected to the respective sense amplifiers 558. The sense amplifiers 558 have a function of reading the potentials of the bit lines 553 as data.

As shown in FIG. 13B, the memory cell 556 includes a transistor 551 and a capacitor 552. A gate of the transistor 551 is electrically connected to the word line 554. A source of the transistor 551 is electrically connected to the bit line 553. A drain of the transistor 551 is electrically connected to one terminal of the capacitor 552. The other terminal of the capacitor 552 is electrically connected to the capacitor line 555.

FIG. 13C illustrates an example of a cross-sectional structure of the memory cell. FIG. 13C is a cross-sectional view of the semiconductor device including the transistor 551, the wirings 524a and 524b connected to the transistor 551, an insulating film 520 over the transistor 551 and the wirings 524a and 524b, and the capacitor 552 over the insulating film 520.

Note that in FIG. 13C, the transistor illustrated in FIGS. 8A to 8C is used as the transistor 551. Therefore, for components of the transistor 551 which are not particularly described below, refer to the description in the above embodiment.

The description of the interlayer insulating film 518 is referred to for the insulating film 520. Alternatively, a resin film of a polyimide resin, an acrylic resin, an epoxy resin, a silicone resin, or the like may be used as the insulating film 520.

The capacitor 552 includes an electrode 526 in contact with the wiring 524b, an electrode 528 overlapping with the electrode 526, and an insulating film 522 provided between the electrode 526 and the electrode 528.

The electrode 526 may be formed of a single layer or a stacked layer of a simple substance selected from aluminum, titanium, chromium, cobalt, nickel, copper, yttrium, zirconium, molybdenum, silver, tantalum, and tungsten; a nitride containing one or more kinds of the above substances; an oxide containing one or more kinds of the above substances; or an alloy containing one or more kinds of the above substances.

The electrode 528 may be formed of a single layer or a stacked layer of a simple substance selected from aluminum, titanium, chromium, cobalt, nickel, copper, yttrium, zirconium, molybdenum, silver, tantalum, and tungsten; a nitride containing one or more kinds of the above substances; an oxide containing one or more kinds of the above substances; or an alloy containing one or more kinds of the above substances.

The insulating film 522 may be formed of a single layer or a stacked layer using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

Note that although FIG. 13C shows an example where the transistor 551 and the capacitor 552 are provided in different layers, one embodiment of the present invention is not limited to this structure. For example, the transistor 551 and the capacitor 552 may be provided in the same plane. With such a structure, memory cells having similar structures can be disposed so as to overlap with each other, in which case, a large number of memory cells can be integrated in an area for one memory cell. Accordingly, the degree of integration of the semiconductor device can be improved. Note that in this specification, "A overlaps with B" means that A and B are provided such that at least part of A overlaps with at least part of B.

Here, the wiring 524a in FIG. 13C is electrically connected to the bit line 553 in FIG. 13B. The gate electrode 504 in FIG. 13C is electrically connected to the word line 554 in FIG. 13B. The electrode 528 in FIG. 13C is electrically connected to the capacitor line 555 in FIG. 13B.

As shown in FIG. 13D, a voltage held in the capacitor 552 gradually decreases with time due to leakage through the transistor 551. A voltage originally charged from V0 to V1 is decreased with time to VA that is a limit for reading out data 1. This period is called a holding period T_1. In the case of a two-level memory cell, refresh operation needs to be performed within the holding period T_1.

For example, in the case where the off-state current of the transistor 551 is not sufficiently small, the holding period T_1 becomes short because the voltage held in the capacitor 552 significantly changes with time. Accordingly, refresh operation needs to be frequently performed. An increase in frequency of refresh operation increases power consumption of the semiconductor device.

Since the off-state current of the transistor 551 is extremely small in this embodiment, the holding period T_1 can be made extremely long. Further, the frequency of refresh operation can be reduced; thus, power consumption can be reduced. For example, in the case where a memory cell is formed using the transistor 551 having an off-state current of $1 \times 10^{-21}$ A to $1 \times 10^{-25}$ A, data can be held for several days to several decades without supply of electric power.

As described above, according to one embodiment of the present invention, a semiconductor device with high degree of integration and low power consumption can be provided.

Figure 14A:
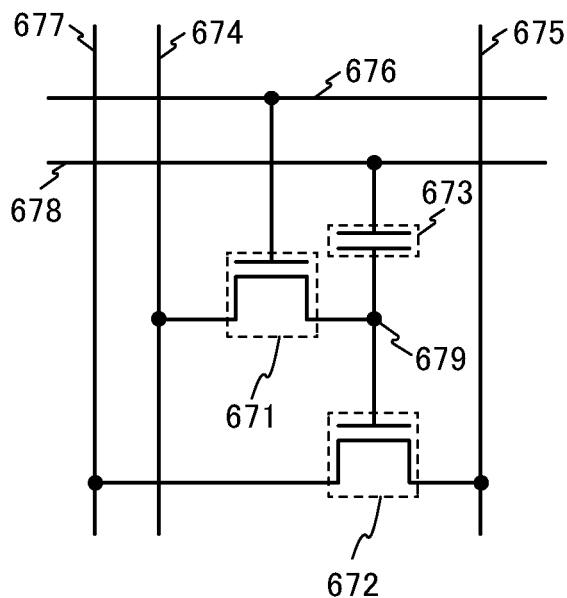
FIGS. 14A to 14C are a circuit diagram and a cross-sectional view illustrating a semiconductor device according to one embodiment of the present invention, and a graph showing electrical characteristics thereof.
Figure 14B:
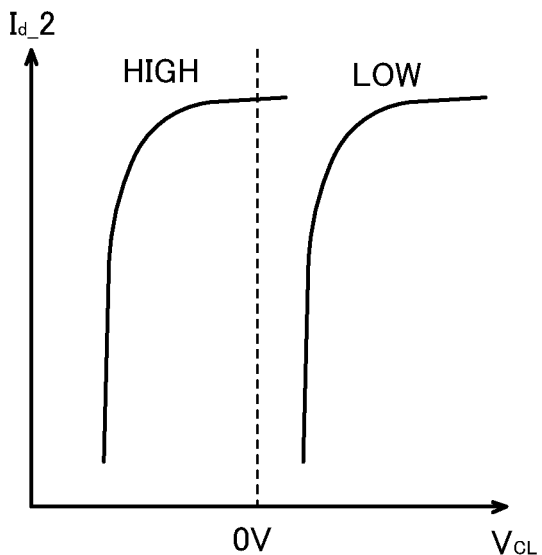
Figure 14C:
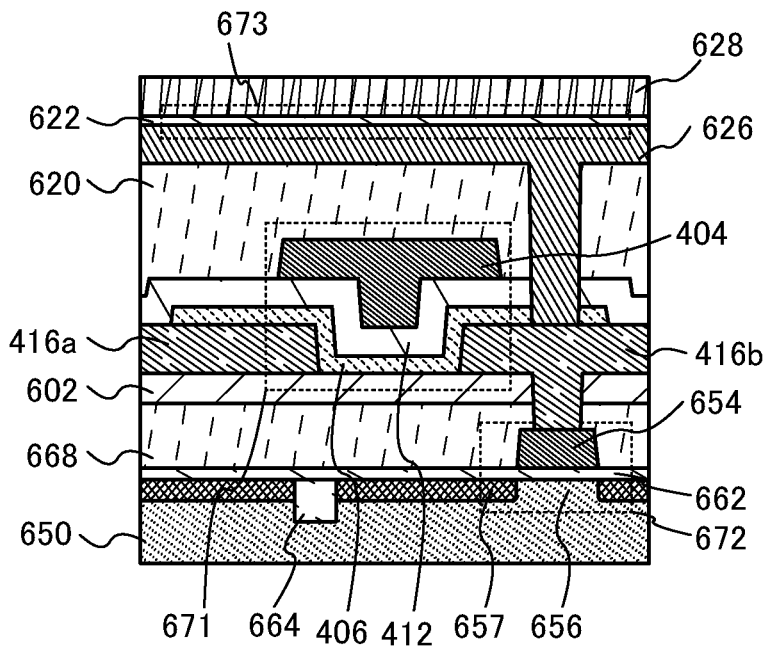

Next, a semiconductor device having a structure different from that of the semiconductor device in FIGS. 13A to 13D is described with reference to FIGS. 14A to 14C. FIG. 14A is a circuit diagram showing a memory cell and wirings included in the semiconductor device. FIG. 14B is a graph showing the electric characteristics of the memory cell in FIG. 14A. FIG. 14C is an example of a cross-sectional view corresponding to the memory cell in FIG. 14A.

As shown in FIG. 14A, the memory cell includes a transistor 671, a transistor 672, and a capacitor 673. Here, a gate of the transistor 671 is electrically connected to a word line 676. A source of the transistor 671 is electrically connected to a source line 674. A drain of the transistor 671 is electrically connected to a gate of the transistor 672 and one terminal of the capacitor 673. A portion where the drain of the transistor 671 is electrically connected to the gate of the transistor 672 and the one terminal of the capacitor 673 is referred to as a node 679. A source of the transistor 672 is electrically connected to a source line 675. A drain of the transistor 672 is electrically connected to a drain line 677. The other terminal of the capacitor 673 is electrically connected to a capacitor line 678.

The semiconductor device illustrated in FIGS. 14A to 14C utilizes variation in the apparent threshold voltage of the transistor 672, which depends on the potential of the node 679. For example, FIG. 14B shows a relation between a voltage $V_{CL}$ of the capacitor line 678 and a drain current $I_{d\_2}$ flowing through the transistor 672.

The potential of the node 679 can be controlled through the transistor 671. For example, the potential of the source line 674 is set to a power supply potential VDD. In this case, when the potential of the word line 676 is set to be higher than or equal to a potential obtained by adding the power supply potential VDD to the threshold voltage Vth of the transistor 671, the potential of the node 679 can be HIGH. Further, when the potential of the word line 676 is set to be lower than or equal to the threshold voltage Vth of the transistor 671, the potential of the node 679 can be LOW.

Thus, the transistor 672 has electric characteristics shown with either a $V_{CL}$-$I_{d\_2}$ curve denoted as LOW or a $V_{CL}$-$I_{d\_2}$ curve denoted as HIGH. That is, when the potential of the node 679 is LOW, $I_d\_2$ is small at a $V_{CL}$ of 0 V; accordingly, data 0 is stored. Further, when the potential of the node 679 is HIGH, $I_d\_2$ is large at a $V_{CL}$ of 0 V; accordingly, data 1 is stored. In this manner, data can be stored.

FIG. 14C illustrates an example of a cross-sectional structure of the memory cell. FIG. 14C is a cross-sectional view of the semiconductor device including the transistor 672, an insulating film 668 over the transistor 672, the transistor 671 over the insulating film 668, an insulating film 620 over the transistor 671, and the capacitor 673 over the insulating film 620.

The description of the protective insulating film 118 is referred to for the insulating film 620. Alternatively, a resin film of a polyimide resin, an acrylic resin, an epoxy resin, a silicone resin, or the like may be used as the insulating film 620.

Note that in FIG. 14C, the transistor illustrated in FIGS. 7A to 7C is used as the transistor 671. Therefore, for components of the transistor 671 which are not particularly described below, refer to the description in the above embodiment.

The transistor including crystalline silicon has an advantage that on-state characteristics can be improved more easily than a transistor including an oxide semiconductor film. Therefore, it can be said that the transistor including crystalline silicon is suitable for the transistor 672 for which excellent on-state characteristics are required.

Here, the transistor 672 includes the channel region 656 and impurity regions 657 which are provided in the semiconductor substrate 650, the element isolation layer 664 which fills a groove portion provided in the semiconductor substrate 650, the gate insulating film 662 provided over the semiconductor substrate 650, and the gate electrode 654 provided over the channel region 656 with the gate insulating film 662 therebetween.

A single crystal semiconductor substrate or a polycrystalline semiconductor substrate of silicon, silicon carbide, or the like or a compound semiconductor substrate of silicon germanium or the like may be used as the semiconductor substrate 650.

In this embodiment, the transistor 672 is provided in a semiconductor substrate; however, one embodiment of the present invention is not limited thereto. For example, a structure may be employed in which a substrate having an insulating surface is used instead of the semiconductor substrate and a semiconductor film is provided on the insulating surface. Here, a glass substrate, a ceramic substrate, a quartz substrate, or a sapphire substrate may be used as the substrate having an insulating surface, for example. Further, any of the transistors including an oxide semiconductor film described in the above embodiment may be used as the transistor 672.

The impurity regions 657 include an impurity which imparts one conductivity type to the semiconductor substrate 650.

The element isolation layer 664 may be formed of a single layer or a stacked layer using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The gate insulating film 662 may be formed of a single layer or a stacked layer using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The description of the gate electrode 104 is referred to for the gate electrode 654.

The description of the protective insulating film 118 is referred to for the insulating film 668. Alternatively, a resin film of a polyimide resin, an acrylic resin, an epoxy resin, a silicone resin, or the like may be used as the insulating film 668.

The insulating film 668 and the base insulating film 602 include an opening reaching the gate electrode 654 of the transistor 672. The drain electrode 416b of the transistor 671 is in contact with the gate electrode 654 of the transistor 672 through the opening.

The capacitor 673 includes an electrode 626 in contact with the drain electrode 416b, an electrode 628 overlapping with the electrode 626, and an insulating film 622 provided between the electrode 626 and the electrode 628.

The description of the electrode 526 is referred to for the electrode 626.

The description of the electrode 528 is referred to for the electrode 628.

Here, the source electrode 416a in FIG. 14C is electrically connected to the source line 674 in FIG. 14A. The gate electrode 404 in FIG. 14C is electrically connected to the word line 676 in FIG. 14A. Further, the electrode 628 in FIG. 14C is electrically connected to the capacitor line 678 in FIG. 14A.

Note that although FIG. 14C shows an example where the transistor 671 and the capacitor 673 are provided in different layers, one embodiment of the present invention is not limited to this structure. For example, the transistor 671 and the capacitor 673 may be provided in the same plane. With such a structure, memory cells having similar structures can be disposed so as to overlap with each other, in which case, a large number of memory cells can be integrated in an area for one memory cell. Accordingly, the degree of integration of the semiconductor device can be improved.

Here, when any of the transistors including an oxide semiconductor film described in the above embodiment is used as the transistor 671, charge accumulated in the node 679 can be prevented from leaking through the transistor 671 because the off-state current of the transistor is extremely small. Therefore, data can be held for a long period. Further, a voltage necessary for writing data does not need to be high as compared to the case of a flash memory; thus, power consumption can be made lower and operation speed can be made higher.

As described above, according to one embodiment of the present invention, a semiconductor device with high degree of integration and low power consumption can be provided.

This embodiment can be implemented in appropriate combination with any of the other embodiments and example.

Embodiment 6

A central processing unit (CPU) can be formed with the use of any of the transistors including an oxide semiconductor film described in the above embodiment or any of the semiconductor devices including a memory element described in the above embodiment for at least part of the CPU.

Figure 15A:
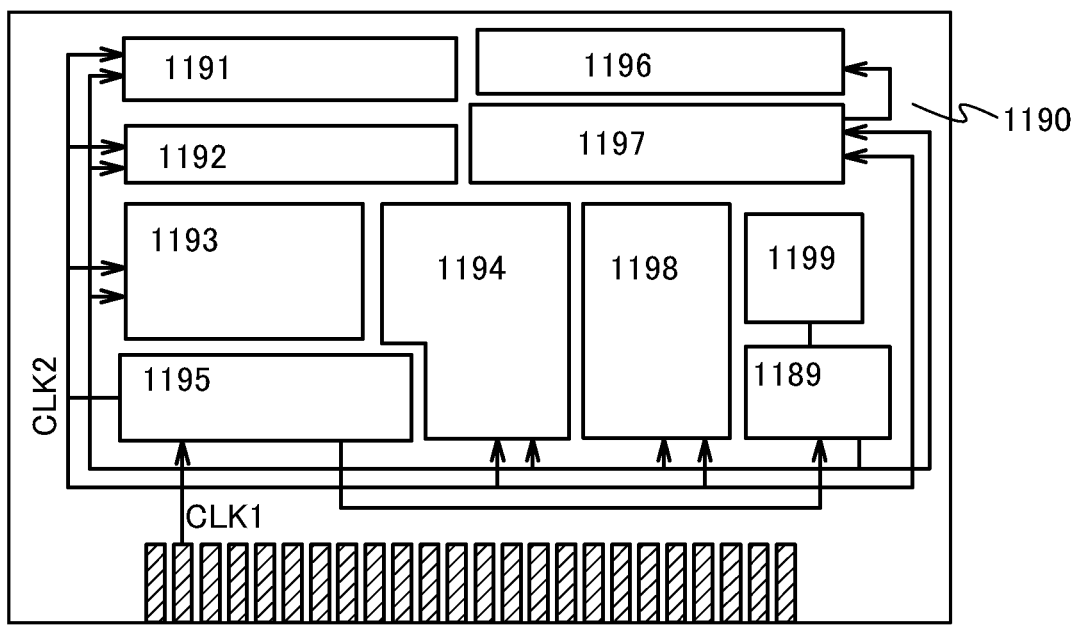
FIGS. 15A to 15C are block diagrams illustrating a structure of a CPU according to one embodiment of the present invention.

FIG. 15A is a block diagram illustrating a specific structure of a CPU. The CPU illustrated in FIG. 15A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190.

A semiconductor substrate, an SOI substrate, a glass substrate, or the like is used as the substrate 1190. The ROM 1199 and the ROM interface 1189 may be provided over a separate chip. Obviously, the CPU illustrated in FIG. 15A is just an example in which the configuration is simplified, and actual CPUs may have various configurations depending on the application.

An instruction input to the CPU through the bus interface 1198 is input to the instruction decoder 1193, decoded therein, and then input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit on the basis of its priority or a mask state. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the clock signal CLK2 to the above circuits.

In the CPU illustrated in FIG. 15A, a memory element is provided in the register 1196. For the register 1196, any of the semiconductor devices including a memory element described in the above embodiment can be used.

In the CPU illustrated in FIG. 15A, the register controller 1197 selects operation of retaining data in the register 1196 in accordance with an instruction from the ALU 1191. That is, the register controller 1197 selects whether data is retained by a flip flop or a capacitor in the memory element included in the register 1196. When data is retained by the flip flop, a power supply voltage is supplied to the memory element in the register 1196. When data is retained by the capacitor, the data in the capacitor is rewritten, and supply of the power supply voltage to the memory element in the register 1196 can be stopped.

Figure 15B:
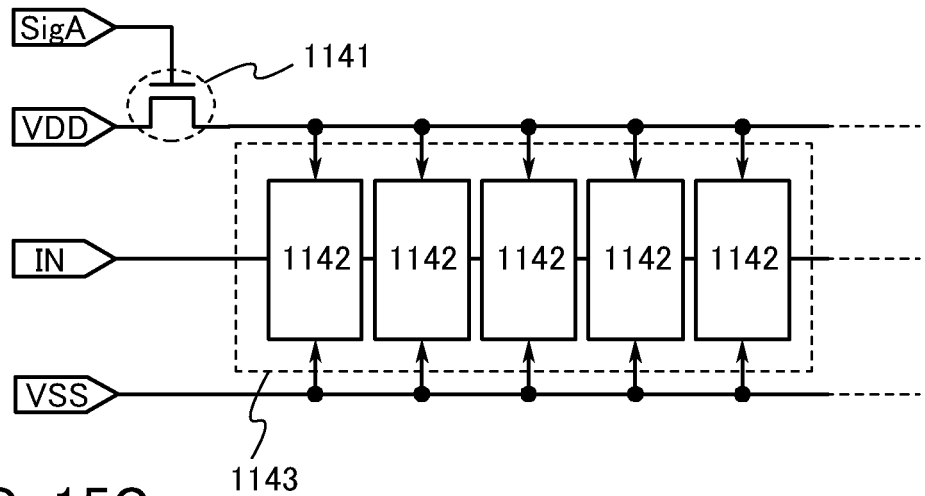
Figure 15C:
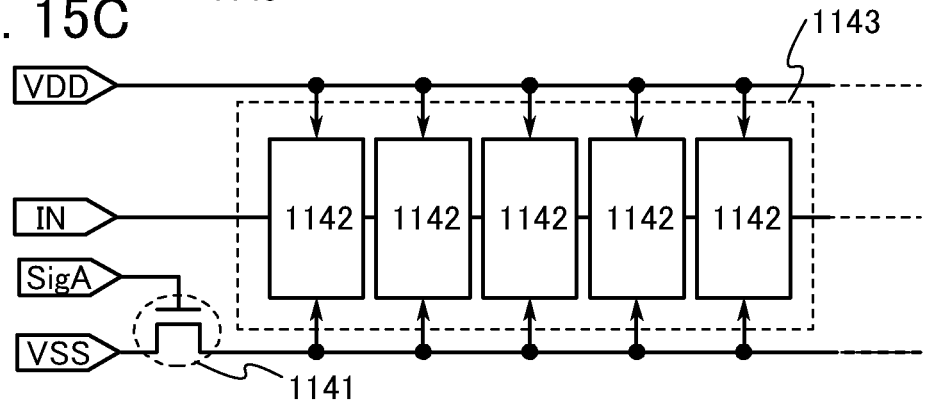

A switching element provided between a memory element group and a node to which a power supply potential VDD or a power supply potential VSS is supplied, as illustrated in FIG. 15B or FIG. 15C, allows the power supply to be stopped. Circuits illustrated in FIGS. 15B and 15C are described below.

FIGS. 15B and 15C each illustrate an example of a structure including any of the transistors including an oxide semiconductor film described in the above embodiment as a switching element for controlling supply of a power supply potential to a memory element.

The memory device illustrated in FIG. 15B includes a switching element 1141 and a memory element group 1143 including a plurality of memory elements 1142. Specifically, as each of the memory elements 1142, any of the semiconductor devices including a memory element described in the above embodiment can be used. Each of the memory elements 1142 included in the memory element group 1143 is supplied with the high-level power supply potential VDD through the switching element 1141. Further, each of the memory elements 1142 included in the memory element group 1143 is supplied with a potential of a signal IN and the low-level power supply potential VSS.

In FIG. 15B, as the switching element 1141, any of the transistors including an oxide semiconductor film described in the above embodiment is used. The transistors can have extremely low off-state current. The switching of the transistor is controlled by a signal SigA input to a gate thereof.

Note that FIG. 15B illustrates the structure in which the switching element 1141 includes only one transistor; however, one embodiment of the present invention is not limited thereto. The switching element 1141 may include a plurality of transistors. In the case where the switching element 1141 includes a plurality of transistors functioning as switching elements, the plurality of transistors may be connected to each other in parallel, in series, or in combination of parallel connection and series connection.

FIG. 15C shows an example of a memory device in which each of the memory elements 1142 included in the memory element group 1143 is supplied with the low-level power supply potential VSS through the switching element 1141. The supply of the low-level power supply potential VSS to each of the memory elements 1142 included in the memory element group 1143 can be controlled by the switching element 1141.

When a switching element is provided between a memory element group and a node to which the power supply potential VDD or the power supply potential VSS is supplied, data can be retained even in the case where an operation of a CPU is temporarily stopped and the supply of the power supply voltage is stopped; accordingly, power consumption can be reduced. For example, while a user of a personal computer does not input data to an input device such as a keyboard, the operation of the CPU can be stopped, so that the power consumption can be reduced.

Although the CPU is given as an example here, the transistor and the semiconductor device can also be applied to an LSI such as a digital signal processor (DSP), a custom LSI, or a field programmable gate array (FPGA).

This embodiment can be implemented in appropriate combination with any of the other embodiments and example.

Embodiment 7

In this embodiment, a display device to which any of the transistors described in the above embodiment is applied will be described.

As a display element provided in the display device, a liquid crystal element (also referred to as a liquid crystal display element), a light-emitting element (also referred to as a light-emitting display element), or the like can be used. A light-emitting element includes, in its category, an element whose luminance is controlled by current or voltage, and specifically an inorganic electroluminescent (EL) element, an organic EL element, and the like. Furthermore, a display medium whose contrast is changed by an electric effect, such as electronic ink, can be used as the display element. In this embodiment, a display device including an EL element and a display device including a liquid crystal element will be described as examples of the display device.

Note that the display device in this embodiment includes in its category a panel in which a display element is sealed, and a module in which an IC such as a controller is mounted on the panel.

Additionally, the display device in this embodiment refers to an image display device, a display device, or a light source (including a lighting device). The display device includes any of the following modules in its category: a module provided with a connector such as an FPC or TCP; a module in which a printed wiring board is provided at the end of TCP; and a module in which an integrated circuit (IC) is mounted directly on a display element by a COG method.

Figure 16A:
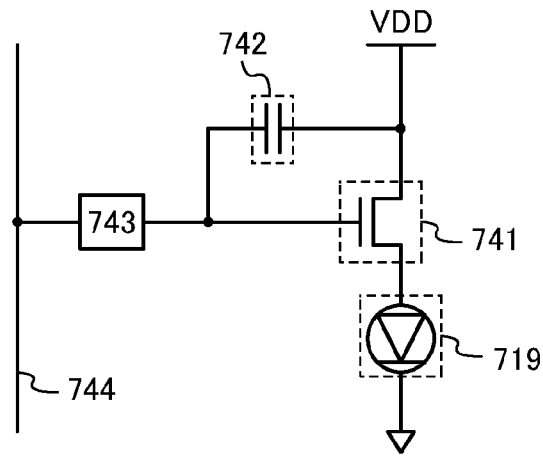
FIGS. 16A to 16C are a circuit diagram of a display device including an EL element according to one embodiment of the present invention, a cross-sectional view of part of a pixel of the display device, and a cross-sectional view of a light-emitting layer of the display device.

FIG. 16A is an example of a circuit diagram of the display device including an EL element.

The display device illustrated in FIG. 16A includes a switching element 743, a transistor 741, a capacitor 742, and a light-emitting element 719.

A gate of the transistor 741 is electrically connected to one terminal of the switch element 743 and one terminal of the capacitor 742. A source of the transistor 741 is electrically connected to one terminal of the light-emitting element 719. A drain of the transistor 741 is electrically connected to the other terminal of the capacitor 742 and is supplied with a power supply potential VDD. The other terminal of the switch element 743 is electrically connected to a signal line 744. The other terminal of the light-emitting element 719 is supplied with a fixed potential. Note that the fixed potential is a ground potential GND or lower.

As the transistor 741, any of the transistors including an oxide semiconductor film described in the above embodiment is used. The transistor has favorable switching characteristics. Consequently, a display device having high display quality can be obtained.

As the switching element 743, it is preferred to use a transistor. With a transistor, the area of a pixel can be reduced, so that a display device having a high resolution can be obtained. Moreover, as the switching element 743, any of the transistors including an oxide semiconductor film described in the above embodiment may be used. With the use of the transistor as the switching element 743, the switching element 743 can be formed in the same process as the transistor 741; thus, the productivity of the display device can be improved.

Figure 16B:
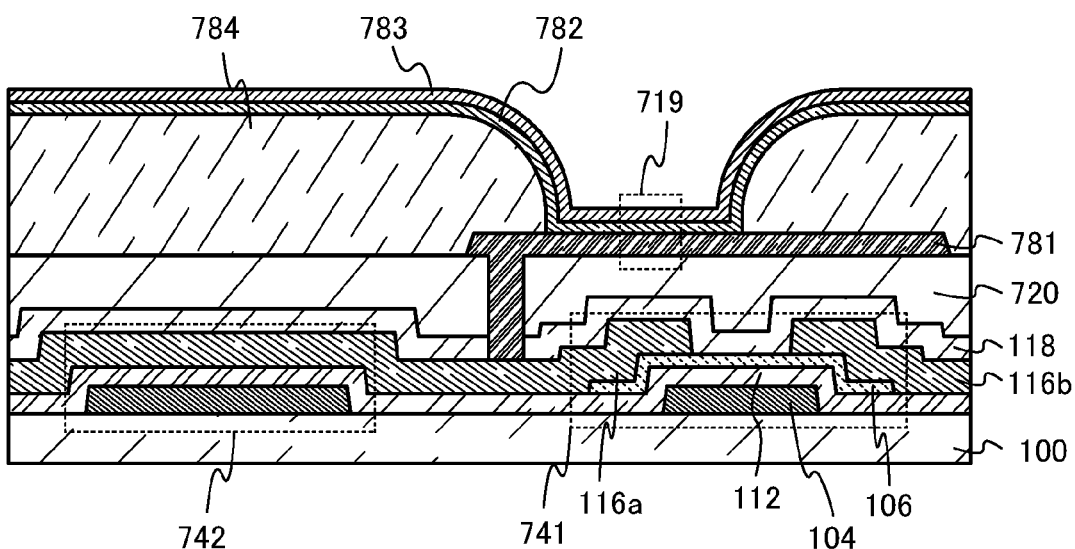

FIG. 16B illustrates part of a cross section of a pixel including the transistor 741, the capacitor 742, and the light-emitting element 719.

Note that FIG. 16B shows an example where the transistor 741 and the capacitor 742 are provided in the same plane. With such a structure, the capacitor 742 can be formed through the same steps as a gate electrode, a gate insulating film, and a source electrode (drain electrode), which are included in the transistor 741. When the transistor 741 and the capacitor 742 are provided in the same plane in this manner, the number of manufacturing steps of the display device can be reduced; thus, the productivity can be increased.

In the example of FIG. 16B, the transistor illustrated in FIGS. 3A to 3C is used as the transistor 741. Therefore, for components of the transistor 741 which are not particularly described below, refer to the description in the above embodiment.

An insulating film 720 is provided over the transistor 741 and the capacitor 742.

Here, an opening reaching the source electrode 116a of the transistor 741 is provided in the insulating film 720 and the protective insulating film 118.

An electrode 781 is provided over the insulating film 720. The electrode 781 is connected to the source electrode 116a of the transistor 741 through the opening provided in the insulating film 720 and the protective insulating film 118.

A partition 784 having an opening reaching the electrode 781 is provided over the electrode 781.

A light-emitting layer 782 in contact with the electrode 781 through the opening provided in the partition 784 is provided over the partition 784.

An electrode 783 is provided over the light-emitting layer 782.

A region where the electrode 781, the light-emitting layer 782, and the electrode 783 overlap with one another serves as the light-emitting element 719.

Note that description of the protective insulating film 118 is referred to for the insulating film 720. Alternatively, a resin film of a polyimide resin, an acrylic resin, an epoxy resin, a silicone resin, or the like may be used.

Figure 16C:
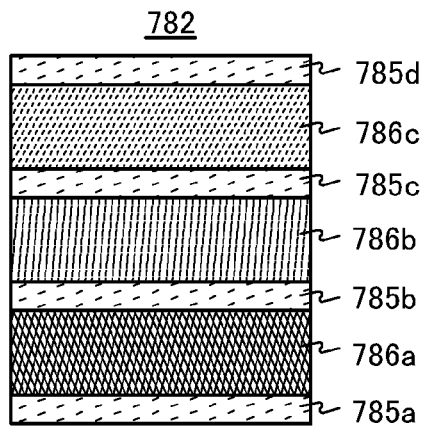

The light-emitting layer 782 is not limited to a single layer, and may be a stack of plural kinds of light-emitting layers and the like. For example, a structure illustrated in FIG. 16C may be employed. FIG. 16C illustrates the structure in which an intermediate layer 785a, a light-emitting layer 786a, an intermediate layer 785b, a light-emitting layer 786b, an intermediate layer 785c, a light-emitting layer 786c, and an intermediate layer 785d are stacked in this order. In that case, when light-emitting layers emitting light of appropriate colors are used as the light-emitting layer 786a, the light-emitting layer 786b, and the light-emitting layer 786c, the light-emitting element 719 with a high color rending property or higher emission efficiency can be formed.

White light may be obtained by stacking plural kinds of light-emitting layers. Although not illustrated in FIG. 16B, white light may be extracted through coloring layers.

Although the structure in which three light-emitting layers and four intermediate layers are provided is shown here, the number of light-emitting layers and the number of intermediate layers can be changed as appropriate. For example, the light-emitting layer 782 can be formed with only the intermediate layer 785a, the light-emitting layer 786a, the intermediate layer 785b, the light-emitting layer 786b, and the intermediate layer 785c. Alternatively, the light-emitting layer 782 may be formed with the intermediate layer 785a, the light-emitting layer 786a, the intermediate layer 785b, the light-emitting layer 786b, the light-emitting layer 786c, and the intermediate layer 785d; the intermediate layer 785c may be omitted.

Further, the intermediate layer can be formed using a stacked-layer structure including any of a hole-injection layer, a hole-transport layer, an electron-transport layer, an electron-injection layer, and the like. Note that not all of these layers need to be provided as the intermediate layer. Any of these layers may be selected as appropriate to form the intermediate layer. Note that layers having similar functions may be provided. Further, an electron-relay layer or the like may be added as appropriate as the intermediate layer, in addition to a carrier generation layer.

The electrode 781 can be formed using a conductive film having a transmitting property with respect to visible light. To have a transmitting property with respect to visible light means that the average transmittance of light in a visible light region (for example, a wavelength range from 400 nm to 800 nm) is higher than or equal to 70%, particularly higher than or equal to 80%.

As the electrode 781, for example, an oxide film such as an In—Zn—W oxide film, an In—Sn oxide film, an In—Zn oxide film, an In oxide film, a Zn oxide film, or a Sn oxide film may be used. The above oxide film may contain a minute amount of Al, Ga, Sb, F, or the like. Further, a metal thin film having a thickness enough to transmit light (preferably, approximately 5 nm to 30 nm) can also be used. For example, an Ag film, a Mg film, or an Ag—Mg alloy film with a thickness of 5 nm may be used.

The electrode 781 is preferred to be a film which efficiently reflects visible light. For example, a film containing lithium, aluminum, titanium, magnesium, lanthanum, silver, silicon, or nickel can be used as the electrode 781.

The electrode 783 can be formed using any of the films for the electrode 781. Note that when the electrode 781 has a transmitting property with respect to visible light, it is preferred that the electrode 783 efficiently reflect visible light. When the electrode 781 efficiently reflects visible light, it is preferred that the electrode 783 have a transmitting property with respect to visible light.

Positions of the electrode 781 and the electrode 783 are not limited to the structure illustrated in FIG. 16B, and the electrode 781 and the electrode 783 may be replaced with each other. It is preferred to use a conductive film having a high work function for the electrode which serves as an anode and a conductive film having a low work function for the electrode which serves as a cathode. Note that in the case where a carrier generation layer is provided in contact with the anode, a variety of conductive films can be used for the anode regardless of their work functions.

Note that description of the protective insulating film 118 is referred to for the partition 784. Alternatively, a resin film of a polyimide resin, an acrylic resin, an epoxy resin, a silicone resin, or the like may be used.

The transistor 741 connected to the light-emitting element 719 has favorable switching characteristics. Therefore, a display device having high display quality can be provided.

Next, the display device including a liquid crystal element is described.

Figure 17A:
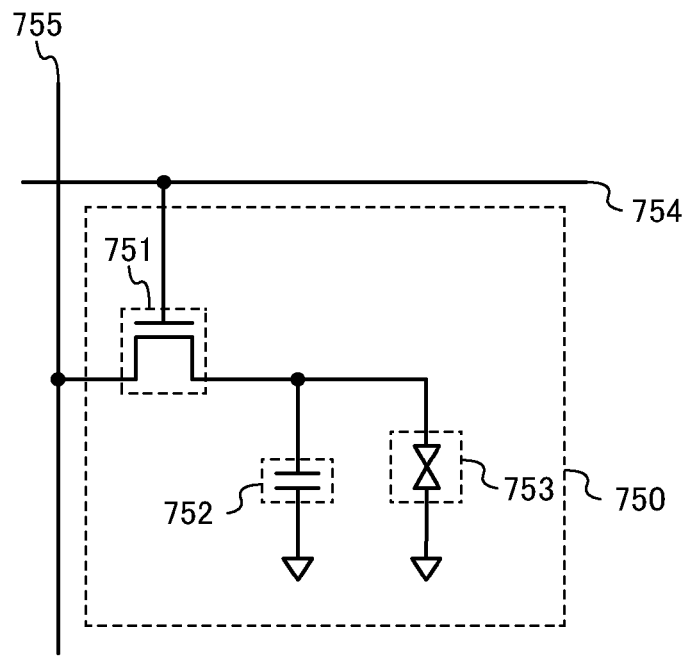
FIGS. 17A and 17B are a circuit diagram of a pixel of a display device including a liquid crystal element according to one embodiment of the present invention and a cross-sectional view of the pixel.

FIG. 17A is a circuit diagram illustrating a structure example of the pixel of the display device including a liquid crystal element. A pixel 750 illustrated in FIG. 17A includes a transistor 751, a capacitor 752, and an element in which liquid crystal is filled between a pair of electrodes (hereinafter also referred to as a liquid crystal element) 753.

One of a source and a drain of the transistor 751 is electrically connected to a signal line 755, and a gate of the transistor 751 is electrically connected to a scan line 754.

One of electrodes of the capacitor 752 is electrically connected to the other of the source and the drain of the transistor 751, and the other of the electrodes of the capacitor 752 is electrically connected to a wiring for supplying a common potential.

One of electrodes of the liquid crystal element 753 is electrically connected to the other of the source and the drain of the transistor 751, and the other of the electrodes of the liquid crystal element 753 is electrically connected to a wiring for supplying a common potential. Note that the common potential supplied to the other of the electrodes of the liquid crystal element 753 may be different from the common potential supplied to the wiring electrically connected to the other of the electrodes of the capacitor 752.

Figure 17B:
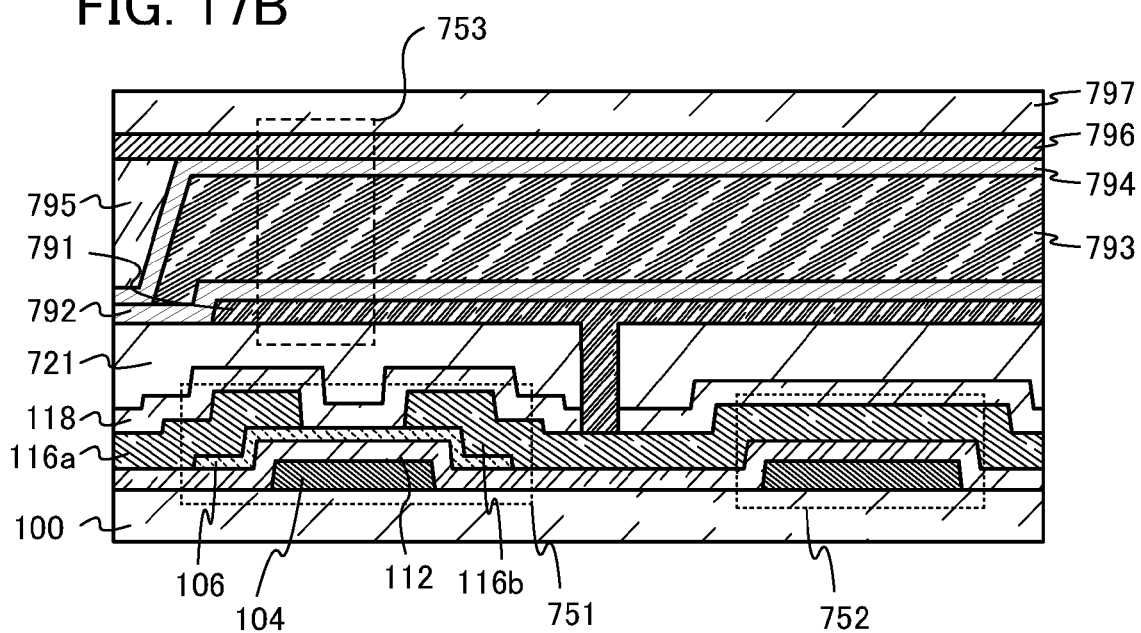

FIG. 17B illustrates part of a cross section of the pixel 750.

Note that FIG. 17B shows an example where the transistor 751 and the capacitor 752 are provided in the same plane. With such a structure, the capacitor 752 can be formed through the same steps as a gate electrode, a gate insulating film, and a source electrode (drain electrode), which are included in the transistor 751. When the transistor 751 and the capacitor 752 are provided in the same plane in this manner, the number of manufacturing steps of the display device can be reduced; thus, the productivity can be increased.

As the transistor 751, any of the transistors described in the above embodiment can be used. In the example of FIG. 17B, the transistor illustrated in FIGS. 3A to 3C is used. Therefore, for components of the transistor 751 which are not particularly described below, refer to the description in the above embodiment.

Note that the transistor 751 can be a transistor having extremely low off-state current. Thus, charge held in the capacitor 752 is unlikely to leak and a voltage applied to the liquid crystal element 753 can be retained for a long time. Accordingly, when a motion image with less movement or a still image is displayed, a voltage for operating the transistor 751 is not needed by turning off the transistor 751, whereby a display device with low power consumption can be obtained.

An insulating film 721 is provided over the transistor 751 and the capacitor 752.

Here, an opening reaching the drain electrode 116b of the transistor 751 is provided in the insulating film 721 and the protective insulating film 118.

An electrode 791 is provided over the insulating film 721. The electrode 791 is in contact with the drain electrode 116b of the transistor 751 through the opening provided in the insulating film 721 and the protective insulating film 118.

An insulating film 792 serving as an alignment film is provided over the electrode 791.

A liquid crystal layer 793 is provided over the insulating film 792.

An insulating film 794 serving as an alignment film is provided over the liquid crystal layer 793.

A spacer 795 is provided over the insulating film 794.

An electrode 796 is provided over the spacer 795 and the insulating film 794.

A substrate 797 is provided over the electrode 796.

Note that description of the protective insulating film 118 is referred to for the insulating film 721. Alternatively, a resin film of a polyimide resin, an acrylic resin, an epoxy resin, a silicone resin, or the like may be used.

For the liquid crystal layer 793, a thermotropic liquid crystal, a low-molecular liquid crystal, a polymer liquid crystal, a polymer-dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

For the liquid crystal layer 793, a liquid crystal exhibiting a blue phase may be used. In that case, the insulating films 792 and 794 serving as an alignment film are not necessarily provided.

The electrode 791 can be formed using a conductive film having a transmitting property with respect to visible light.

As the electrode 791, for example, an oxide film such as an In—Zn—W oxide film, an In—Sn oxide film, an In—Zn oxide film, an In oxide film, a Zn oxide film, or a Sn oxide film may be used. The above oxide film may contain a minute amount of Al, Ga, Sb, F, or the like. Further, a metal thin film having a thickness enough to transmit light (preferably, approximately 5 nm to 30 nm) can also be used.

The electrode 791 is preferred to be a film which efficiently reflects visible light. For example, a film containing aluminum, titanium, chromium, copper, molybdenum, silver, tantalum, or tungsten can be used as the electrode 791.

The electrode 796 can be formed using any of the films for the electrode 791. Note that when the electrode 791 has a transmitting property with respect to visible light, it is preferred that the electrode 796 efficiently reflect visible light. When the electrode 791 efficiently reflects visible light, it is preferred that the electrode 796 have a transmitting property with respect to visible light.

Positions of the electrode 791 and the electrode 796 are not limited to the structure illustrated in FIG. 17B, and the electrode 791 and the electrode 796 may be replaced with each other.

Each of the insulating films 792 and 794 may be formed using an organic compound or an inorganic compound.

The spacer 795 may be formed using an organic compound or an inorganic compound. Note that the spacer 795 can have a variety of shapes such as a columnar shape and a spherical shape.

A region where the electrode 791, the insulating film 792, the liquid crystal layer 793, the insulating film 794, and the electrode 796 overlap with one another serves as the liquid crystal element 753.

As the substrate 797, a glass substrate, a resin substrate, a metal substrate, or the like can be used. The substrate 797 may have flexibility.

The transistor 751 connected to the liquid crystal element 753 has favorable switching characteristics. Therefore, a display device having high display quality can be provided. Since the transistor 751 can have extremely low off-state current, a display device with low power consumption can be provided.

This embodiment can be implemented in appropriate combination with any of the other embodiments and example.

Embodiment 8

In this embodiment, examples of an electronic device including any of the semiconductor devices described in the above embodiments will be described.

Figure 18A:
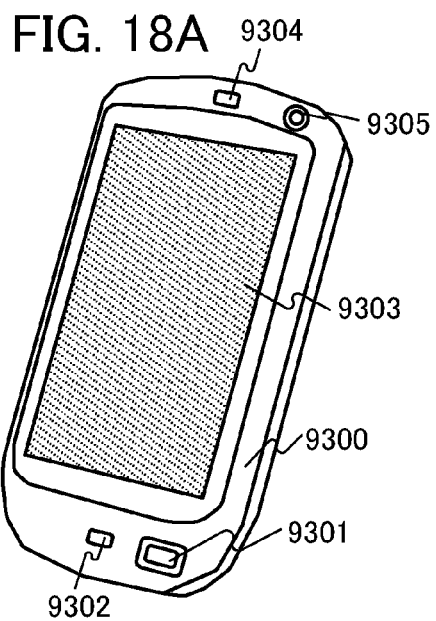
FIGS. 18A to 18D each illustrate an electronic device according to one embodiment of the present invention.

FIG. 18A illustrates a portable information terminal. The portable information terminal illustrated in FIG. 18A includes a housing 9300, a button 9301, a microphone 9302, a display portion 9303, a speaker 9304, and a camera 9305, and has a function as a mobile phone. One embodiment of the present invention can be applied to an arithmetic unit, a wireless circuit, or a memory circuit in a main body. One embodiment of the present invention can also be applied to the display portion 9303.

Figure 18B:
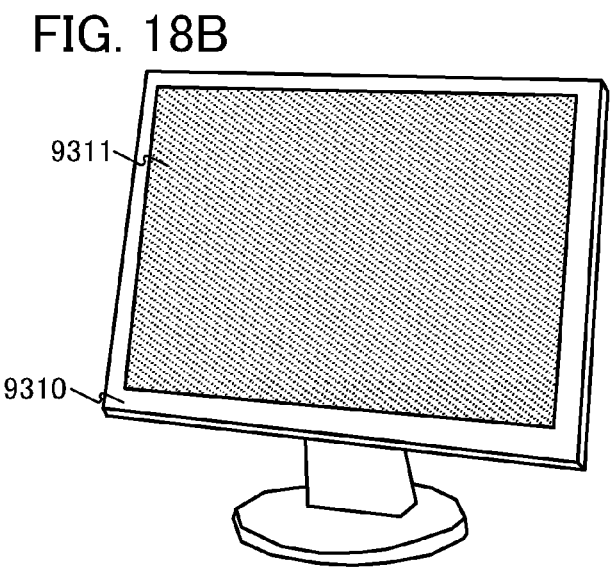

FIG. 18B illustrates a display. The display illustrated in FIG. 18B includes a housing 9310 and a display portion 9311. One embodiment of the present invention can be applied to an arithmetic unit, a wireless circuit, or a memory circuit in a main body. One embodiment of the present invention can also be applied to the display portion 9311.

Figure 18C:
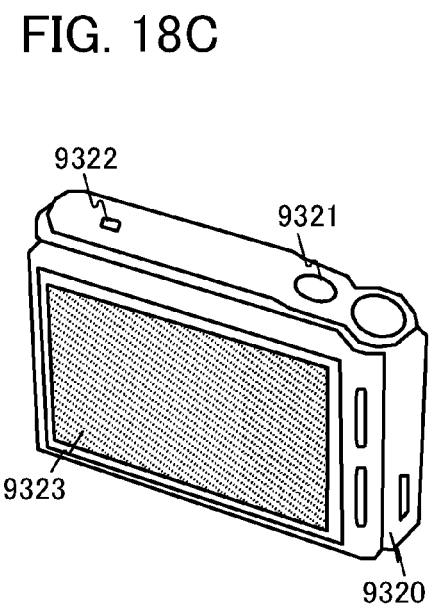

FIG. 18C illustrates a digital still camera. The digital still camera illustrated in FIG. 18C includes a housing 9320, a button 9321, a microphone 9322, and a display portion 9323. One embodiment of the present invention can be applied to an arithmetic unit, a wireless circuit, or a memory circuit in a main body. One embodiment of the present invention can also be applied to the display portion 9323.

Figure 18D:
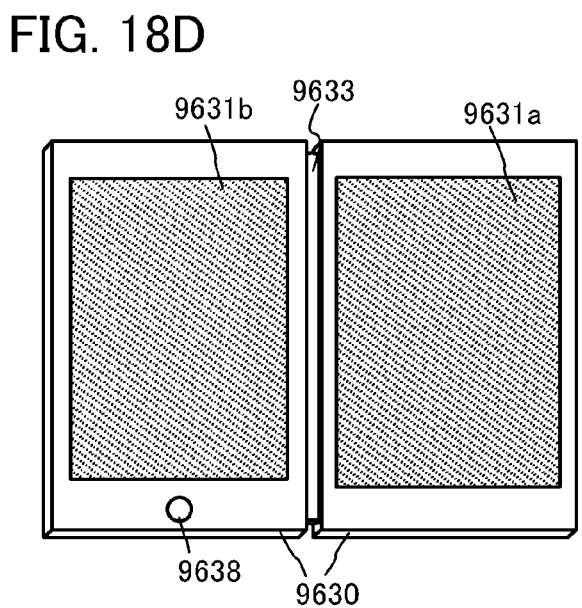

FIG. 18D illustrates a double-foldable portable information terminal. The double-foldable portable information terminal illustrated in FIG. 18D includes a housing 9630, a display portion 9631*a*, a display portion 9631*b*, a hinge 9633, and an operation switch 9638. One embodiment of the present invention can be applied to an arithmetic unit, a wireless circuit, or a memory circuit in a main body. One embodiment of the present invention can also be applied to the display portion 9631*a* and the display portion 9631*b*.

Part or whole of the display portion 9631*a* and/or the display portion 9631*b* can function as a touch panel. By touching an operation key displayed on the touch panel, a user can input data, for example.

With the use of a semiconductor device according to one embodiment of the present invention, an electronic device with high performance and low power consumption can be provided.

This embodiment can be implemented in appropriate combination with any of the other embodiments and example.

Example 1

In this example, a PL spectrum of a sample including an oxide semiconductor film provided over a substrate and an insulating film provided over the oxide semiconductor film was evaluated by low-temperature PL spectroscopy. In addition, the electric characteristics of a transistor including a structure similar to that of the sample were evaluated.

Samples whose PL spectra were evaluated by low-temperature PL spectroscopy are described below.

First, a quartz substrate was prepared. Next, heat treatment was performed to remove hydrogen, water, or the like contained in the quartz substrate. The heat treatment was performed at 850° C. for four hours in a nitrogen gas atmosphere.

Next, an oxide semiconductor film was formed. As the oxide semiconductor film, a 100 nm thick In—Ga—Zn oxide film was formed by a sputtering method using an In—Ga—Zn oxide (In:Ga:Zn=1:1:1 [atomic ratio]) target in the following manner. An argon gas (flow rate: 100 sccm) and an oxygen gas (flow rate: 100 sccm) were used as deposition gases and the pressure was set to 0.6 Pa. The substrate surface temperature was set to and kept for four minutes at 170° C., followed by application of an AC power of 5000 W.

Next, heat treatment was performed to remove hydrogen, water, or the like contained in the oxide semiconductor film. The heat treatment was performed at 350° C. for one hour in a nitrogen gas atmosphere.

Further, heat treatment was performed to reduce oxygen vacancies generated in the oxide semiconductor film. The heat treatment was performed at 350° C. for one hour in an atmosphere in which a nitrogen gas and an oxygen gas were mixed at a ratio of $N_2:O_2=8:2$.

Next, an insulating film was formed. As the insulating film, a 400 nm thick silicon oxynitride film was formed by a plasma CVD method in the following manner. A $SiH_4$ gas (flow rate: 30 sccm, 120 sccm, 160 sccm, or 200 sccm) and an $N_2O$ gas (flow rate: 4000 sccm) were used as deposition gases and the pressure was set to 40 Pa, 200 Pa, or 250 Pa. The substrate surface temperature was set to and kept for five minutes at 220° C., followed by application of an RF power of 150 W, 1000 W, 1500 W, or 2000 W. Note the area of an electrode used for application of electric power was 5986 $cm^2$.

Next, heat treatment was performed. The heat treatment was performed at 300° C. for one hour in an atmosphere in which a nitrogen gas and an oxygen gas were mixed at a ratio of $N_2:O_2=8:2$.

Table 1 shows sample names and the conditions of the silicon oxynitride film used as the insulating film.

TABLE 1

| Sample Name | $SiH_4$ gas | Pressure | Electric power |
|---|---|---|---|
| Sample 1 | 30 sccm | 40 Pa | 150 W |
| Sample 2 | 30 sccm | 200 Pa | 150 W |
| Sample 3 | 120 sccm | 40 Pa | 1000 W |
| Sample 4 | 120 sccm | 200 Pa | 1000 W |
| Sample 5 | 160 sccm | 250 Pa | 1500 W |
| Sample 6 | 160 sccm | 200 Pa | 2000 W |
| Sample 7 | 200 sccm | 200 Pa | 2000 W |

The PL spectra of the samples 1 to 7 were evaluated by low-temperature PL spectroscopy. A PL microscope (LabRAM HR-PL) manufactured by HORIBA, Ltd. was used for the evaluation. The measurement temperature was set to 10 K.

As excitation light, He—Cd laser light (325 nm) with an energy density of 110.4 μW/mm² was used. Further, a CCD detector (CCD-1024×256-OPEN-SYN manufactured by HORIBA Jobin Yvon Inc.) was used for detection of the PL spectra.

Results of the evaluation by low-temperature PL spectroscopy are described later.

Next, transistors including structures similar to those of the samples 1 to 7 are described. Note that the structure of each transistor is similar to that shown in FIGS. 3A to 3C and therefore is described with reference to FIGS. 3A to 3C.

Here, a glass substrate with a size of 600 mm×720 mm was used as the substrate 100. A stack of a 100 nm thick silicon nitride film and a 150 nm thick silicon oxynitride film over the silicon nitride film was used as the base insulating film 102. A 100 nm thick tungsten film was used as the gate electrode 104. A 200 nm thick silicon oxynitride film was used as the gate insulating film 112. A 35 nm thick In—Ga—Zn oxide film was used as the oxide semiconductor film 106. A 400 nm thick silicon oxynitride film was used as the protective insulating film 118.

Here, the silicon oxynitride film used as the insulating film in the samples 1 to 7 corresponds to the protective insulating film 118 of the transistor. Accordingly, each of the transistors including structures similar to those of the samples 1 to 7 is the above-described transistor.

In the samples 1 to 7, the thickness of the oxide semiconductor film is set to 100 nm so that the PL spectra are easily evaluated. On the other hand, in the transistors, the thickness of the oxide semiconductor film is set to 35 nm so that transistor characteristics are easily obtained.

The electric characteristics of each of the transistors including structures similar to those of the samples 1 to 7 were evaluated as follows. A transistor with a channel length of 3 μm and a channel width of 3 μm was used, the drain voltage Vd was set to 1 V, the gate voltage Vg was swept from −20 V to 15 V in 0.25 V intervals, and the drain currents Id at respective gate voltages Vg were plotted (the obtained curve is called Vg-Id curve). Note that the measurement was performed at 20 points over the substrate 100, whereby the Vg-Id curves of the transistor were obtained.

Figure 19A:
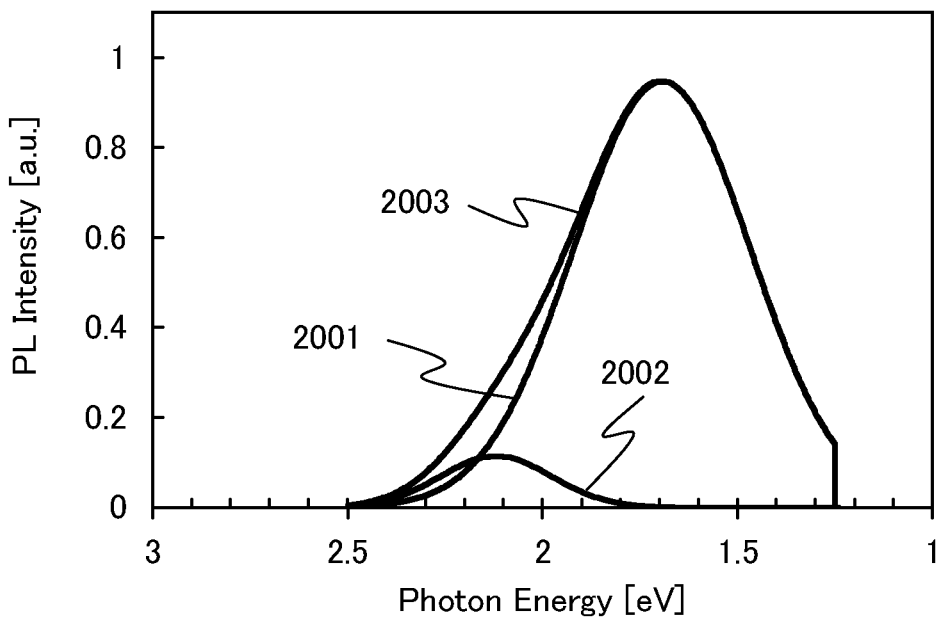
FIGS. 19A and 19B show a PL spectrum of a sample 1 and Vg-Id curves of a transistor including a structure similar to that of the sample 1.
Figure 19B:
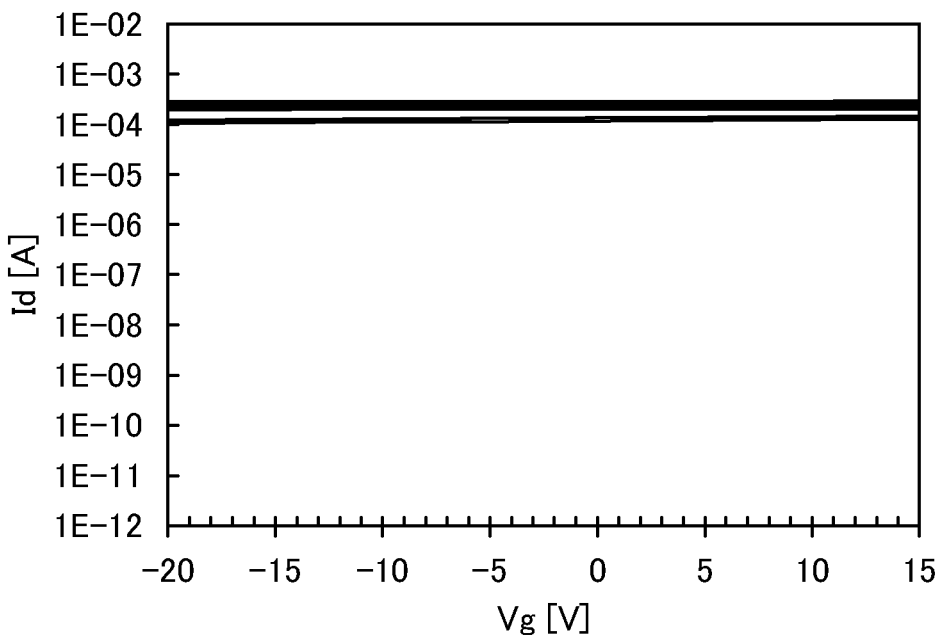
Figure 20A:
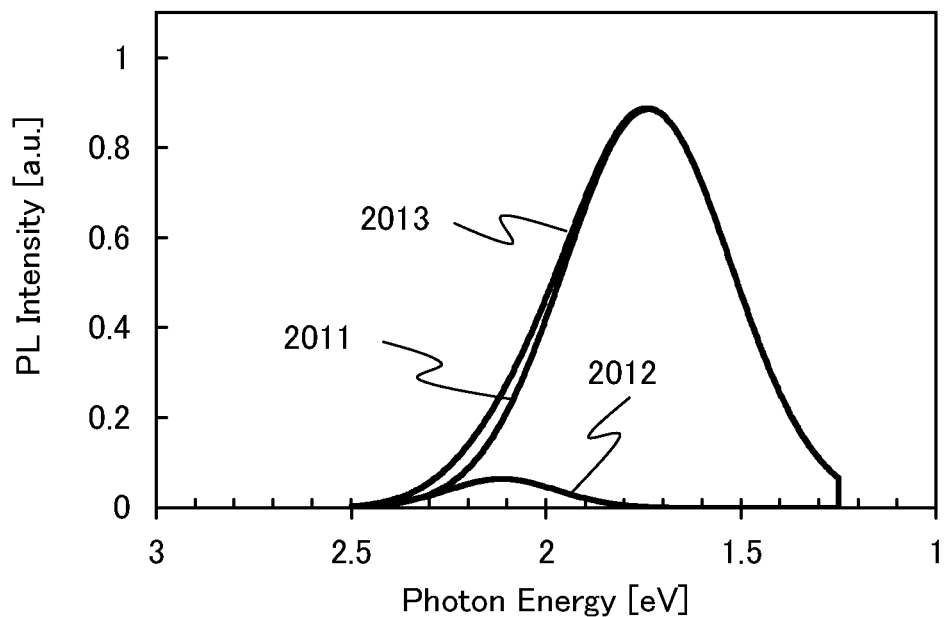
FIGS. 20A and 20B show a PL spectrum of a sample 3 and Vg-Id curves of a transistor including a structure similar to that of the sample 3.
Figure 20B:
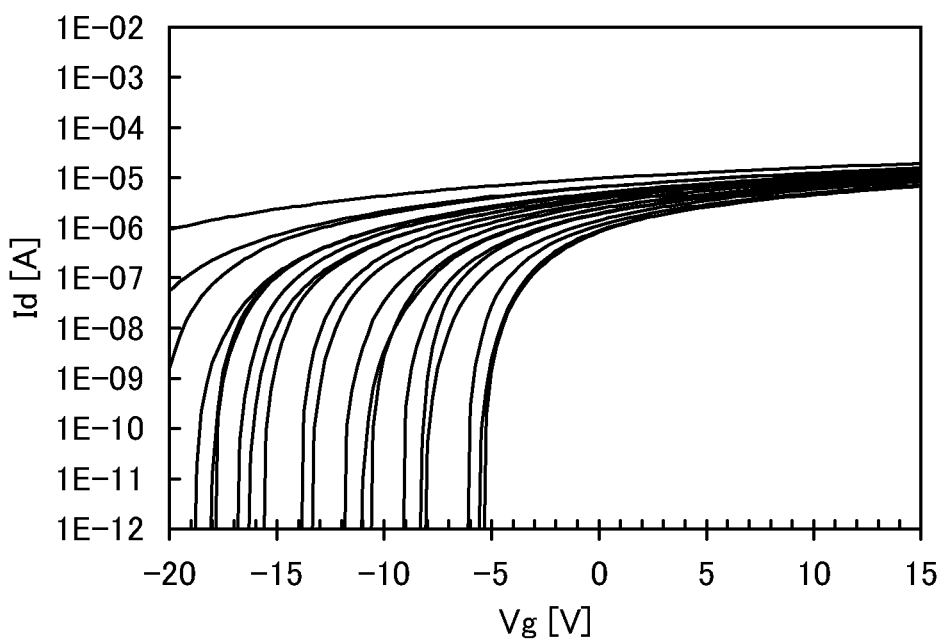
Figure 21A:
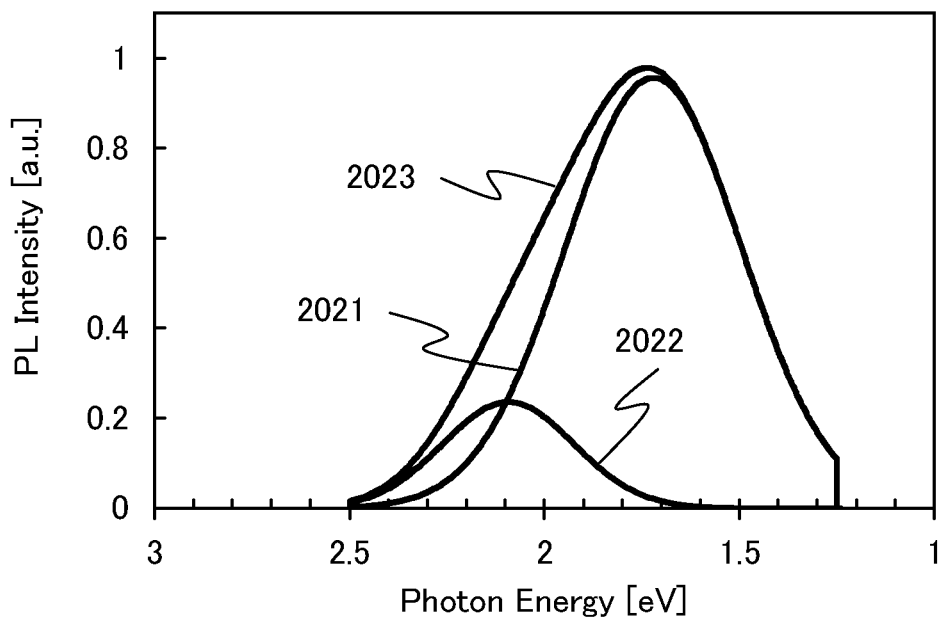
FIGS. 21A and 21B show a PL spectrum of a sample 5 and Vg-Id curves of a transistor including a structure similar to that of the sample 5.
Figure 21B:
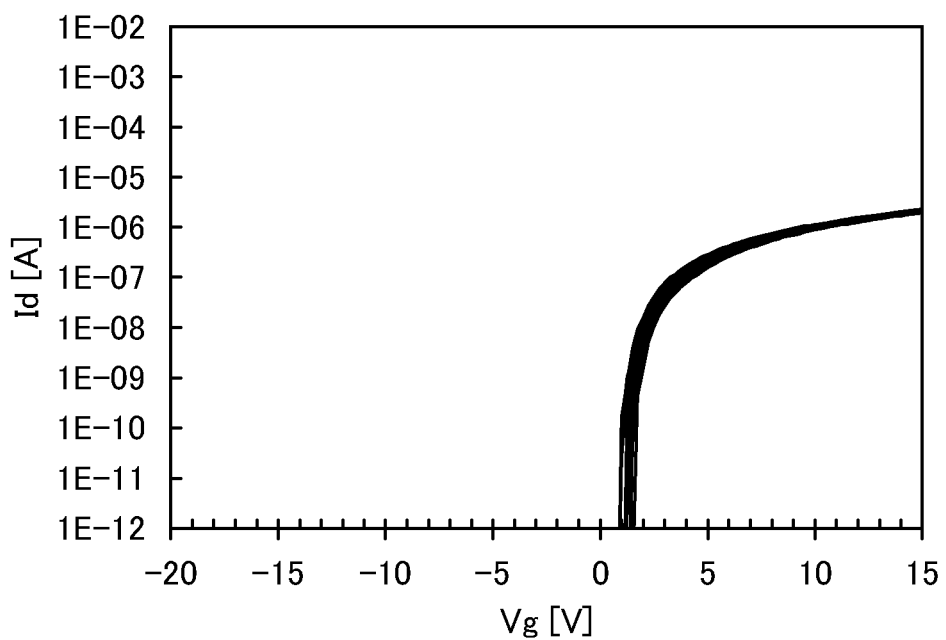
Figure 22A:
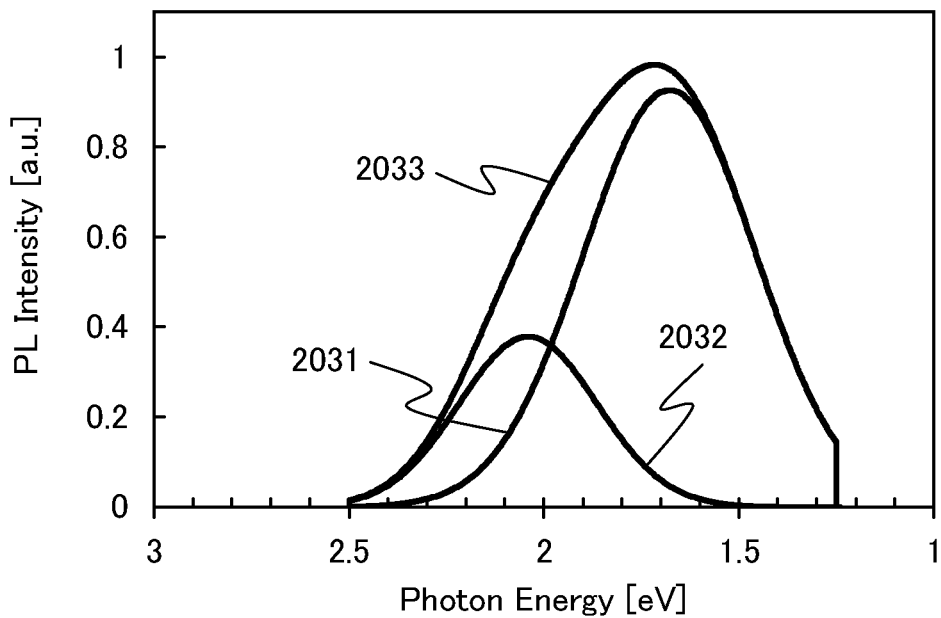
FIGS. 22A and 22B show a PL spectrum of a sample 7 and Vg-Id curves of a transistor including a structure similar to that of the sample 7.
Figure 22B:
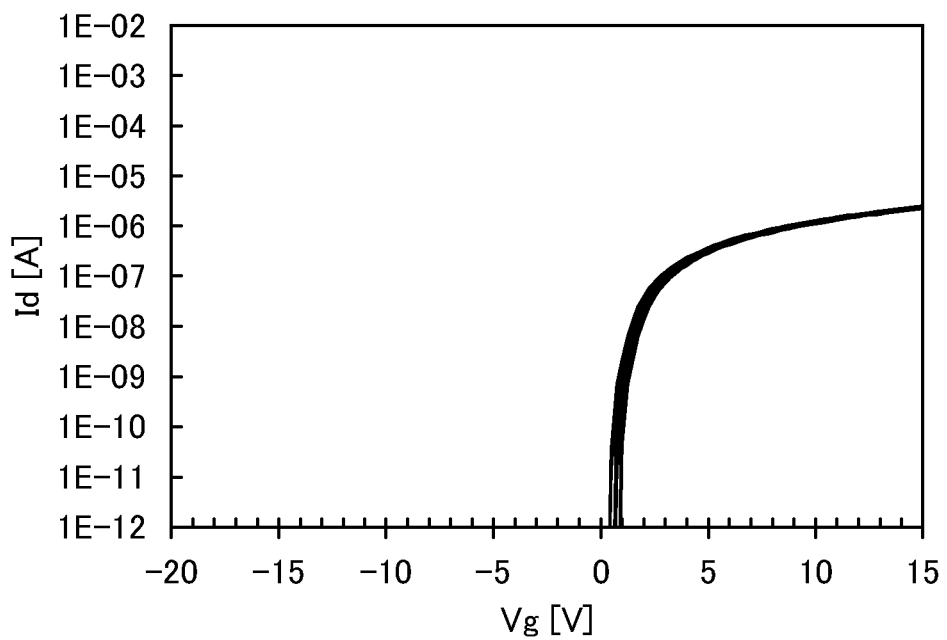

Analysis results of the PL spectra of the samples 1, 3, 5, and 7 and the electric characteristics of the transistors including structures similar to those of the samples are typically shown in FIGS. 19A and 19B, FIGS. 20A and 20B, FIGS. 21A and 21B, and FIGS. 22A and 22B. FIG. 19A shows the analysis result of the PL spectrum of the sample 1, and FIG. 19B shows the Vg-Id curves of the transistor including a structure similar to that of the sample 1. FIG. 20A shows the analysis result of the PL spectrum of the sample 3, and FIG. 20B shows the Vg-Id curves of the transistor including a structure similar to that of the sample 3. FIG. 21A shows the analysis result of the PL spectrum of the sample 5, and FIG. 21B shows the Vg-Id curves of the transistor including a structure similar to that of the sample 5. FIG. 22A shows the analysis result of the PL spectrum of the sample 7, and FIG. 22B shows the Vg-Id curves of the transistor including a structure similar to that of the sample 7.

According to the analysis results of the PL spectra shown in FIG. 19A, FIG. 20A, FIG. 21A, and FIG. 22A, the PL spectrum of each sample which is obtained by subtraction of a background spectrum can be divided into a first curve whose local maximum value is found in a range of greater than or equal to 1.6 eV and less than or equal to 1.8 eV and a second curve whose local maximum value is found in a range of greater than or equal to 1.9 eV and less than or equal to 2.2 eV. Specifically, a PL spectrum 2003 of the sample 1 can be divided into a first curve 2001 and a second curve 2002 (see FIG. 19A). A PL spectrum 2013 of the sample 3 can be divided into a first curve 2011 and a second curve 2012 (see FIG. 20A). A PL spectrum 2023 of the sample 5 can be divided into a first curve 2021 and a second curve 2022 (see FIG. 21A). A PL spectrum 2033 of the sample 7 can be divided into a first curve 2031 and a second curve 2032 (see FIG. 22A).

The Vg-Id curves shown in FIG. 19B and FIG. 20B indicate that the transistor including a structure similar to that of the sample 1 and the transistor including a structure similar to that of the sample 3 cannot have favorable switching characteristics. The Vg-Id curves shown in FIG. 21B and FIG. 22B indicate that the transistor including a structure similar to that of the sample 5 and the transistor including a structure similar to that of the sample 7 can have favorable switching characteristics.

Table 2 shows the analysis results of the PL spectra of the samples 1 to 7 and whether the switching characteristics of the transistors including structures similar to those of the respective samples are favorable. Here, the area of the first curve in the PL spectrum is denoted by S1, and the area of the second curve is denoted by S2. Specifically, S2/(S1+S2), which is a value obtained by dividing the area S2 of the second curve by the sum of the area S1 of the first curve and the area S2 of the second curve, is shown. Further, the peak intensity of the PL spectrum (the highest detection intensity in the PL spectrum in a range of greater than or equal to 1.25 eV and less than or equal to 2.5 eV) is shown. Whether the switching characteristics of each transistor are favorable is expressed by "favorable" when switching is favorably performed and "not favorable" when switching is not favorably performed.

TABLE 2

| Sample Name | S2/(S1 + S2) | Peak intensity | Switching |
|---|---|---|---|
| Sample 1 | 0.07 | 4188/sec | not favorable |
| Sample 2 | 0.11 | 6122/sec | favorable |
| Sample 3 | 0.04 | 5174/sec | not favorable |
| Sample 4 | 0.14 | 4389/sec | favorable |
| Sample 5 | 0.15 | 2352/sec | favorable |
| Sample 6 | 0.23 | 2467/sec | favorable |
| Sample 7 | 0.24 | 2346/sec | favorable |

According to Table 2, the transistors including structures similar to those of the sample 1 and the sample 3, whose S2/(S1+S2) are 0.07 and 0.04, respectively, do not have favorable switching characteristics. The transistors including structures similar to those of the sample 2, the sample 4, the sample 5, the sample 6, and the sample 7, whose S2/(S1+S2) are 0.11, 0.14, 0.15, 0.23, and 0.24, respectively, have favorable switching characteristics.

As described above, it was found that there is a relationship between a PL spectrum of an oxide semiconductor film which is obtained by low-temperature PL spectroscopy and whether the switching characteristics of a transistor including the oxide semiconductor film are favorable. Accordingly, the result of low-temperature PL spectroscopy is an indicator of the switching characteristics of the transistor including the oxide semiconductor film.

Evaluation of an oxide semiconductor film by low-temperature PL spectroscopy is far easier than evaluation of the electric characteristics of a transistor. Thus, by employing this evaluation method, the development speed of a transistor including an oxide semiconductor film can be improved. This evaluation method is useful for in-process evaluation of a transistor including an oxide semiconductor film and a semiconductor device including the transistor. That is, sampling evaluation can be performed during a manufacturing process of the transistor or the semiconductor device and the rest of the manufacturing process can be continued after the evaluation. Establishment of in-process evaluation of a transistor and a semiconductor device can improve the yield thereof.

This example can be implemented in appropriate combination with any of the embodiments.

This application is based on Japanese Patent Application serial no. 2012-103302 filed with Japan Patent Office on Apr. 27, 2012, the entire contents of which are hereby incorporated by reference.

What is claimed is:

1. A transistor comprising:
an oxide semiconductor film comprising at least one of indium, gallium, tin, hafnium, and zinc,
wherein the oxide semiconductor film is configured to give a first photoluminescence spectrum having a first peak and a second photoluminescence spectrum having a second peak,
wherein the first peak is located in a range of greater than or equal to 1.6 eV and less than or equal to 1.8 eV,
wherein the second peak is located in a range of greater than or equal to 1.7 eV and less than or equal to 2.4 eV, and
wherein a ratio of an area of the second photoluminescence spectrum to a sum of an area of the first photoluminescence spectrum and the area of the second photoluminescence spectrum is greater than or equal to 0.1 and less than 1.

2. A transistor comprising:
an oxide semiconductor film;
a gate insulating film in contact with the oxide semiconductor film; and
a gate electrode overlapping with the oxide semiconductor film with the gate insulating film therebetween,
wherein the oxide semiconductor film comprises at least one of indium, gallium, tin, hafnium, and zinc,
wherein the oxide semiconductor film is configured to give a first photoluminescence spectrum having a first peak and a second photoluminescence spectrum having a second peak,
wherein the first peak is located in a range of greater than or equal to 1.6 eV and less than or equal to 1.8 eV,
wherein the second peak is located in a range of greater than or equal to 1.7 eV and less than or equal to 2.4 eV, and
wherein a ratio of an area of the second photoluminescence spectrum to a sum of an area of the first photoluminescence spectrum and the area of the second photoluminescence spectrum is greater than or equal to 0.1 and less than 1.

3. The transistor according to claim 1, wherein the oxide semiconductor film comprises a crystalline portion.

4. The transistor according to claim 2, wherein the oxide semiconductor film comprises a crystalline portion.

5. A liquid crystal display device including the transistor according to claim 2.

6. A light-emitting display device including the transistor according to claim 2.

7. A lighting device including the transistor according to claim 2.

8. An electronic device including the transistor according to claim 2.

9. A portable information terminal including the transistor according to claim 2.

10. The transistor according to claim 1, further comprising a silicon oxynitride film over and in contact with the oxide semiconductor film,
wherein the silicon oxynitride film is formed by a chemical vapor deposition method in which a pressure in a chamber is set to 200 Pa or 250 Pa.

11. The transistor according to claim 1, wherein hydrogen concentration of the oxide semiconductor film is lower than or equal to $5 \times 10^{19}$ atoms/cm$^3$.

12. The transistor according to claim 1, wherein off-state current of the transistor is lower than or equal to $1 \times 10^{-21}$ A.

13. The transistor according to claim 2, further comprising a silicon oxynitride film over and in contact with the oxide semiconductor film,
wherein the silicon oxynitride film is formed by a chemical vapor deposition method in which a pressure in a chamber is set to 200 Pa or 250 Pa, and
wherein the oxide semiconductor film is over the gate electrode.

14. The transistor according to claim 2,
wherein the gate electrode is over the oxide semiconductor film,
wherein the gate insulating film is a silicon oxynitride film, and
wherein the silicon oxynitride film is formed by a chemical vapor deposition method in which a pressure in a chamber is set to 200 Pa or 250 Pa.

15. The transistor according to claim 2, wherein a hydrogen concentration of the oxide semiconductor film is lower than or equal to $5 \times 10^{19}$ atoms/cm$^3$.

16. The transistor according to claim 2, wherein off-state current of the transistor is lower than or equal to $1 \times 10^{-21}$ A.

* * * * *